(12) United States Patent
Onose

(10) Patent No.: US 8,816,355 B2
(45) Date of Patent: Aug. 26, 2014

(54) SEMICONDUCTOR DEVICE

(75) Inventor: Hidekatsu Onose, Hitachi (JP)

(73) Assignee: Hitachi, Ltd., Tokyo (JP)

(\*) Notice: Subject to any disclaimer, the term of this patent is extended or adjusted under 35 U.S.C. 154(b) by 295 days.

(21) Appl. No.: 13/082,385

(22) Filed: Apr. 7, 2011

(65) Prior Publication Data

US 2011/0248286 A1 Oct. 13, 2011

(30) Foreign Application Priority Data

Apr. 8, 2010 (JP) ................. 2010-089132

(51) Int. Cl.
| | | |
|---|---|---|
| *H01L 29/15* | (2006.01) | |
| *H01L 29/66* | (2006.01) | |
| *H01L 29/861* | (2006.01) | |
| *H01L 29/78* | (2006.01) | |
| *H01L 29/73* | (2006.01) | |
| *H01L 29/808* | (2006.01) | |
| *H01L 29/08* | (2006.01) | |
| *H01L 21/265* | (2006.01) | |
| *H01L 29/10* | (2006.01) | |
| *H01L 29/16* | (2006.01) | |
| *H01L 29/45* | (2006.01) | |

(52) U.S. Cl.
CPC .......... *H01L 29/861* (2013.01); *H01L 29/0878* (2013.01); *H01L 29/6606* (2013.01); *H01L 29/7803* (2013.01); *H01L 21/26586* (2013.01); *H01L 29/1004* (2013.01); *H01L 29/66068* (2013.01); *H01L 29/7302* (2013.01); *H01L 29/7813* (2013.01); *H01L 29/1608* (2013.01); *H01L 29/45* (2013.01); *H01L 29/8083* (2013.01); *H01L 29/1066* (2013.01)

USPC ...... 257/77; 257/329; 257/E29.338; 438/138; 438/173

(58) Field of Classification Search
CPC ............ H01L 29/1608; H01L 29/8083; H01L 29/872; H01L 29/861; H01L 29/8611; H01L 29/1066
USPC ........... 257/109, 329, E29.338; 438/138, 173
See application file for complete search history.

(56) References Cited

U.S. PATENT DOCUMENTS

| | | | | | |
|---|---|---|---|---|---|
| 4,215,356 | A | * | 7/1980 | Kato ............................. | 257/263 |
| 4,641,174 | A | * | 2/1987 | Baliga .......................... | 257/264 |
| 5,679,966 | A | * | 10/1997 | Baliga et al. ................. | 257/139 |
| 7,687,825 | B2 | * | 3/2010 | Zhang .......................... | 257/134 |
| 7,808,003 | B2 | * | 10/2010 | Endo et al. ..................... | 257/77 |
| 8,110,870 | B2 | * | 2/2012 | Sugimoto et al. ............ | 257/329 |
| 2003/0020136 | A1 | * | 1/2003 | Kitabatake et al. .......... | 257/502 |
| 2004/0256659 | A1 | * | 12/2004 | Kim et al. ...................... | 257/316 |
| 2007/0023830 | A1 | * | 2/2007 | Pfirsch et al. ................. | 257/341 |
| 2007/0126024 | A1 | * | 6/2007 | Kelberlau ..................... | 257/173 |

(Continued)

FOREIGN PATENT DOCUMENTS

JP 60-74582 A 4/1985

*Primary Examiner* — Cheung Lee
*Assistant Examiner* — Jeremy Joy
(74) *Attorney, Agent, or Firm* — Miles & Stockbridge P.C.

(57) ABSTRACT

For suggesting a structure capable of achieving both a low start-up voltage and high breakdown voltage, a SiC vertical diode includes a cathode electrode, an $n^{++}$ cathode layer, an $n^-$ drift layer on the $n^{++}$ cathode layer, a pair of $p^+$ regions, an $n^+$ channel region formed between the $n^-$ drift layer and the $p^+$ region and sandwiched between the pair of $p^+$ regions, $n^{++}$ anode regions and an anode electrode formed on the $n^{++}$ anode regions and the $p^+$ regions.

8 Claims, 28 Drawing Sheets

(56) References Cited

U.S. PATENT DOCUMENTS

| | | | |
|---|---|---|---|
| 2008/0308838 A1* | 12/2008 | McNutt et al. | 257/133 |
| 2009/0134405 A1* | 5/2009 | Ota et al. | 257/77 |
| 2009/0206398 A1* | 8/2009 | Yoshikawa et al. | 257/330 |
| 2010/0301384 A1* | 12/2010 | Nistor et al. | 257/109 |

* cited by examiner

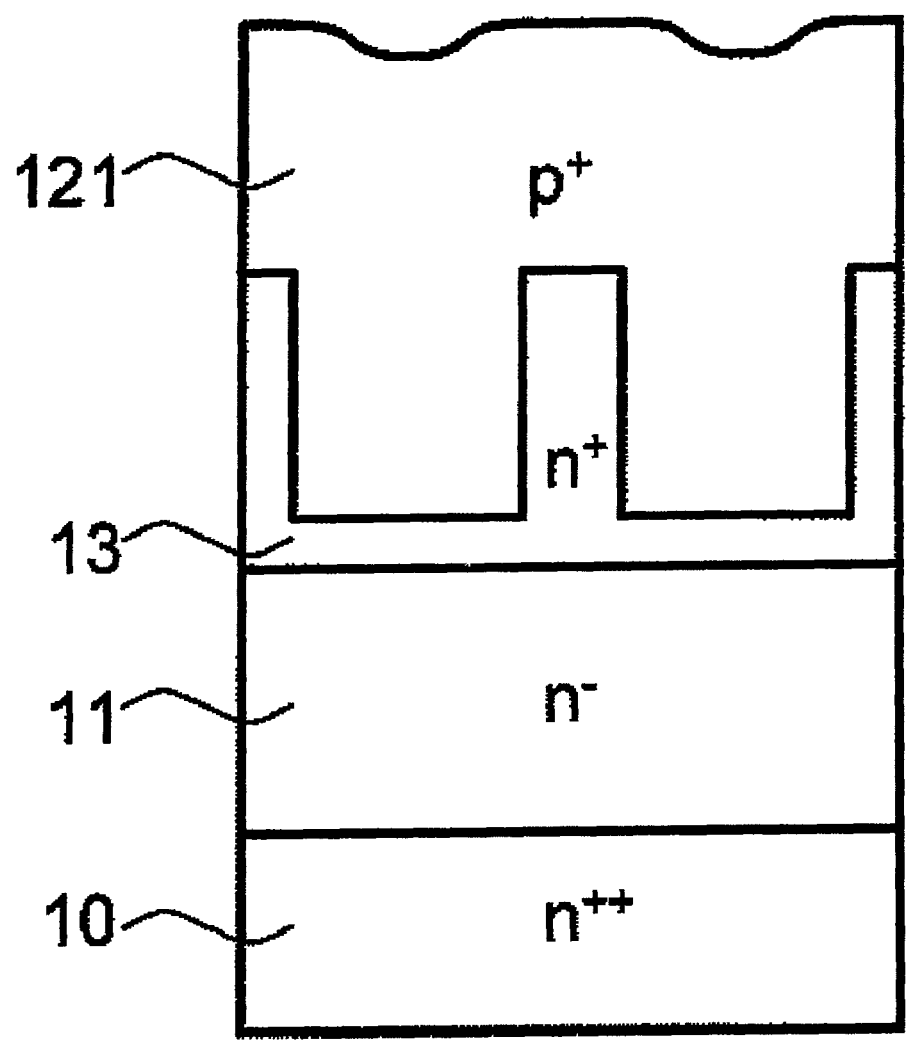

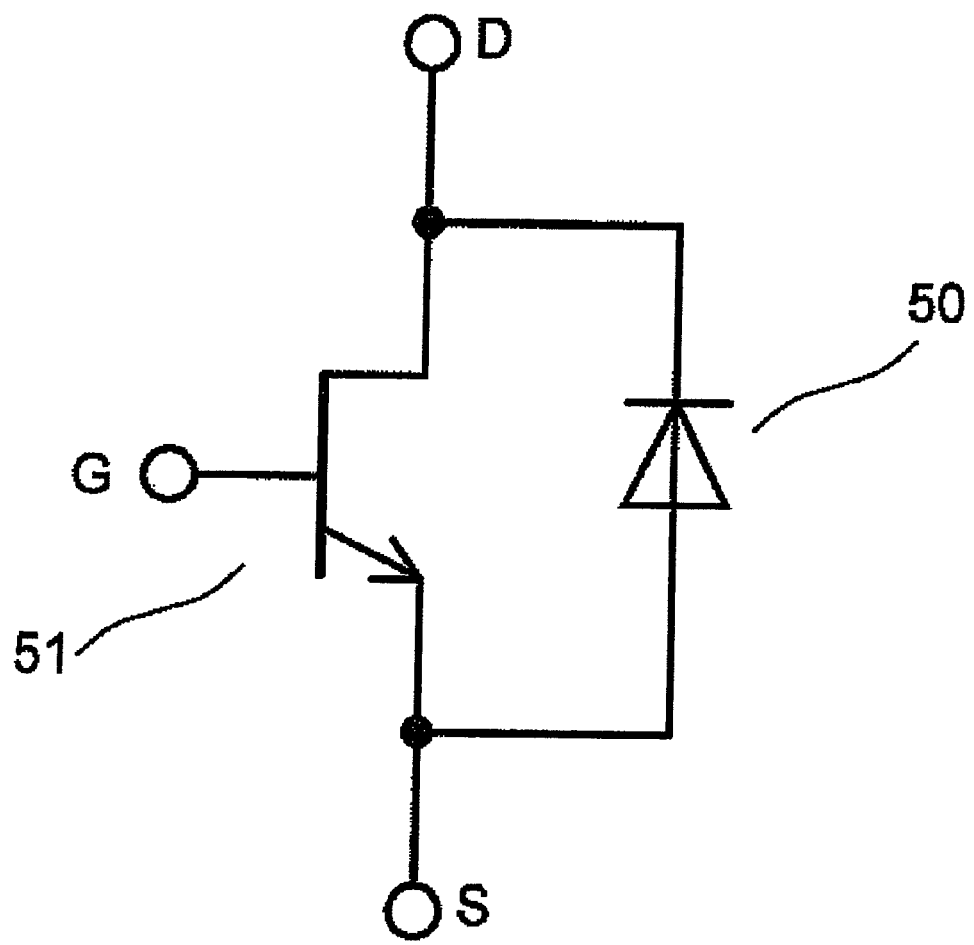

SEMICONDUCTOR DEVICE

CROSS-REFERENCE TO RELATED APPLICATION

The present application claims priority from Japanese Patent Application No. 2010-089132 filed on Apr. 8, 2010, the content of which is hereby incorporated by reference to this application.

TECHNICAL FIELD OF THE INVENTION

The present invention relates to a diode using silicon carbide (SiC) and a structure of a compound device of a diode and a transistor.

BACKGROUND OF THE INVENTION

Since SiC has a high breakdown electric field, it can reduce the device thickness required for achieving a high breakdown voltage to about one-tenth compared with Si. Therefore, the Schottky diode having the breakdown voltage of 300 V or higher, which was unsuitable for practical use in the case of Si due to the large voltage drop which occurs when applying a current, has been realized.

A pn diode is generally used as a Si high breakdown voltage diode. The pn diode is a bipolar device using both electrons and holes as electric conduction carriers, and in the transition from a conduction state to a voltage blocking state corresponding to an off state, excess minority carriers (holes) accumulated in a low impurity concentration layer (generally, n layer) are discharged to generate a recovery current. This becomes a switching loss of a diode. In an inverter, switching devices and diodes are used, and a recovery current of the diode causes the turn-on loss of the switching device. On the other hand, since a Schottky diode is a unipolar device using only electrons (or holes) as carriers, a recovery current like in a pn diode is not generated, and it has the feature of being able to significantly reduce the switching loss of a diode and a switching device. This is the major purpose of applying the Schottky diode up to the high breakdown voltage level.

Meanwhile, a Schottky diode is a device in which rectification occurs by the Schottky junction of metal and semiconductor, and it is affected by built-in potential of the metal-semiconductor junction. For example, in the case of a SiC Schottky diode using Ti as an electrode, a forward voltage drop (hereinafter, referred to as FVD) of 0.9 V or higher is required for causing a current to flow in a forward direction, and it is virtually impossible to operate the SiC Schottky diode with the FVD of 1.0 V or lower. On the other hand, a Si pn diode requires FVD of about 0.6 V and can operate with 1.0 V or lower though current density is not high, and the Si-pn diode has lower loss when compared with respect to the conduction loss.

The structure for avoiding the influence of the built-in potential of the metal-semiconductor junction described above includes a pinch rectifier of Japanese Patent Application Laid-Open Publication No. 60-74582 (Patent Document 1) shown in FIG. 6, which was created for the purpose of improving the switching speed. In the Patent Document 1, the pinch rectifier is made up of a cathode electrode 521, an $n^+$ cathode layer 510, an $n^-$ drift layer 511, $n^+$ contact regions 516, $p^+$ regions 512 disposed to be deeper than the $n^+$ contact region 516 so as to surround the $n^+$ contact region 516 and an anode electrode 522 being in ohmic contact with the $n^+$ contact regions 516 and the $p^+$ regions 512. Since the $n^+$ contact region 516 and the anode electrode 522 are in ohmic contact, the influence of the built-in potential like in the conventional Schottky diode can be eliminated, and the operation with a lower FVD can be achieved. In a reverse-bias state in which the voltage of the cathode electrode 521 side is higher than that of the anode electrode 522, the breakdown voltage is ensured by the pinch-off caused by the depletion layer expanded from the $p^+$ region 512 by the field effect, and this is the structure which can be called as a field-effect diode.

SUMMARY OF THE INVENTION

According to the study by the inventor of the present invention, when the electrode to the $n^+$ contact region 516 and the electrode to the $p^+$ region 512 are independently formed so as to be isolated from each other in FIG. 6, the same structure as a junction FET in which the $n^+$ contact region 516 is a source region, the $p^+$ region 512 is a gate region and the $n^+$ cathode layer 510 is a drain region is obtained. When the diode characteristics are to be achieved in the structure of FIG. 6, it means that the junction FET whose electrode structure only is different has the normally-off type to be in a blocking state in a state where a gate and a source are short-circuited. For achieving the normally-off junction FET with high breakdown voltage, the channel width (space between the $p^+$ regions 512 below the $n^+$ contact region 516) has to be narrowed. In this case, since the channel becomes difficult to open, the threshold voltage of the gate is increased from the viewpoint of the transistor operation. This is equivalent to the increase of the start-up voltage corresponding to the FVD at which current starts up from the viewpoint of the diode operation. More specifically, it shows that it is difficult to achieve both the high breakdown voltage and the low start-up voltage at the same time. For the problem like this, the Patent Document 1 does not make any consideration for achieving both the low start-up voltage and high breakdown voltage because an object of the Patent Document 1 is to improve the switching speed.

An object of the present invention is to provide a novel structure of a field-effect diode capable of achieving both the low start-up voltage and the high breakdown voltage at the same time.

The typical inventions disclosed in this application will be described blow.

The present invention is a semiconductor device using silicon carbide as a substrate, and the semiconductor device includes: a cathode electrode; a cathode layer of a first conductivity type formed on the cathode electrode of the substrate and having a first impurity concentration; a drift layer of the first conductivity type formed on the cathode layer and having a second impurity concentration lower than the first impurity concentration; a pair of first semiconductor regions of a second conductivity type opposite to the first conductivity type formed above the drift layer; a channel region of the first conductivity type formed between the drift layer and the first semiconductor region and sandwiched between the pair of first semiconductor regions and having a third impurity concentration lower than the first impurity concentration and higher than the second impurity concentration; an anode region of the first conductivity type formed on the channel region and having a fourth impurity concentration higher than the third impurity concentration; and an anode electrode formed on the pair of first semiconductor regions and the anode region.

Also, another present invention is a semiconductor device using silicon carbide as a substrate, and the semiconductor device includes: a first region of the substrate in which a diode is formed; a second region of the substrate in which a junction FET is formed; a first electrode formed in the first region and the second region; a first semiconductor region of a first conductivity type formed on the first electrode and having a first impurity concentration; a second semiconductor region of the first conductivity type formed on the first semiconductor region and having a second impurity concentration lower than the first impurity concentration; a pair of third semiconductor regions of a second conductivity type opposite to the first conductivity type formed above the second semiconductor region in the first region; a pair of fourth semiconductor regions of the second conductivity type formed above the second semiconductor region in the second region; fifth semiconductor regions of the first conductivity type formed between the second and third semiconductor regions and between the second and fourth semiconductor regions, sandwiched between the pair of third semiconductor regions and between the pair of fourth semiconductor regions and having a third impurity concentration lower than the first impurity concentration and higher than the second impurity concentration; sixth semiconductor regions of the first conductivity type formed on the fifth semiconductor regions in the first region and having a fourth impurity concentration higher than the third impurity concentration; seventh semiconductor regions of the first conductivity type formed on the fifth semiconductor regions in the second region and having a fifth impurity concentration higher than the third impurity concentration; a second electrode formed on the third and sixth semiconductor regions; a third electrode formed on the seventh semiconductor regions; and fourth electrodes formed on the fourth semiconductor regions.

Further, still another present invention is a semiconductor device using silicon carbide as a substrate, and the semiconductor device includes: a first region of the substrate in which a diode is formed; a second region of the substrate in which a MOSFET is formed; a first electrode formed in the first region and the second region; a first semiconductor region of a first conductivity type formed on the first electrode and having a first impurity concentration; a second semiconductor region of the first conductivity type formed on the first semiconductor region and having a second impurity concentration lower than the first impurity concentration; a pair of third semiconductor regions of a second conductivity type opposite to the first conductivity type formed above the second semiconductor region in the first region; a fourth semiconductor region of the second conductivity type formed above the second semiconductor region in the second region; a fifth semiconductor region of the first conductivity type formed between the second and third semiconductor regions and between the second and fourth semiconductor regions, sandwiched between the pair of third semiconductor regions and having a third impurity concentration lower than the first impurity concentration and higher than the second impurity concentration; sixth semiconductor regions of the first conductivity type formed on the fifth semiconductor region in the first region and having a fourth impurity concentration higher than the third impurity concentration; a seventh semiconductor region of the first conductivity type formed on the fifth semiconductor region in the second region and having a fifth impurity concentration higher than the third impurity concentration; a second electrode formed on the third and sixth semiconductor regions; a third electrode formed on the seventh semiconductor region; and a gate electrode of the MOSFET disposed to the fourth semiconductor regions via an insulating film.

The present invention makes it possible to achieve both the low start-up voltage and the high breakdown voltage at the same time in a field-effect diode.

BRIEF DESCRIPTIONS OF THE DRAWINGS

FIG. 2B is an explanatory diagram showing the manufacturing process of the diode shown in FIG. 1;

FIG. 9 is a circuit diagram showing the third embodiment of the present invention in which the diode of the present invention and a junction FET are combined;

DESCRIPTIONS OF THE PREFERRED EMBODIMENTS

Hereinafter, the present invention will be described in detail based on the embodiments thereof. Note that the descriptions of the case of an n type substrate will be made in the following embodiments, but even when a p type substrate is used, the descriptions are the same except that the conductivity types are reversed.

First Embodiment

Figure 1:
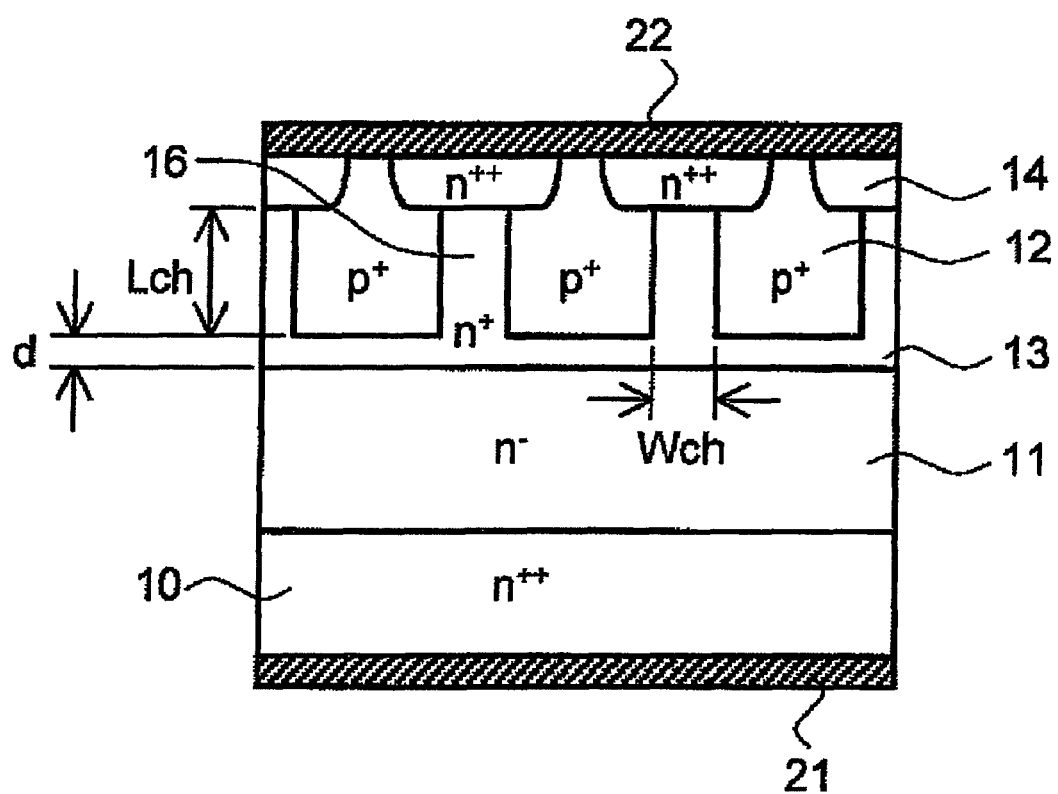
FIG. 1 is schematic cross-sectional view of a diode showing the first embodiment of the present invention.

FIG. 1 is a schematic cross-sectional view of a diode for describing the first embodiment of the present invention. In FIG. 1, a reference numeral 21 denotes a cathode electrode, 10 denotes an $n^{++}$ cathode layer which is a 4H-SiC substrate, 11 denotes an $n^-$ drift layer, 12 denotes a $p^+$ region, 13 denotes an $n^+$ layer, 14 denotes an $n^{++}$ anode region, 16 denotes an $n^+$ channel region and 22 denotes an anode electrode. The cathode layer has an impurity concentration higher than that of the drift layer 11 in order to make a contact with the cathode electrode 21. Similarly, the anode region 14 has an impurity concentration higher than that of the channel region 16 in order to make a contact with the anode electrode 22. Further, Wch denotes a channel width, and the width is almost uniform over a channel length Lch. Furthermore, the lower end of the $p^+$ region 12 is in contact with the $n^+$ layer 13 and is separated from the $n^-$ layer 11 by a distance d in this structure.

Next, the operation of this diode will be described. When a forward voltage is applied to the anode electrode 22, depletion layers expanded to from the $p^+$ regions 12 to the channel region 16 begin to be constricted, and the overlap of the right and left depletion layers disappears at a predetermined voltage and a current path is formed. The voltage at this time is the start-up voltage. The expansion of the depletion layer from the $p^+$ region 12 is reduced as the concentration of the channel region 16 becomes higher, and the start-up voltage is lowered.

Meanwhile, in the blocking state in which the cathode is at a high voltage, the maximum electric field occurs near the bottom of the channel region 16. When the electric field exceeds the limit, the impact ionization occurs and the breakdown is caused. Therefore, for achieving the high breakdown voltage, the reduction of the electric field near the bottom of the channel is important. In the present invention, by making the concentration of the drift region 11 lower than that of the channel region 16, the depletion layer is expanded to the whole $n^-$ drift layer when a high voltage is applied, and the increase in the electric field near the bottom of the channel is reduced and the occurrence of the impact ionization can be suppressed in this structure.

The expansion of the depletion layer inside the channel region 16 does not completely disappear even in the conduction state, and the expansion to the channel side is largest at the bottom of the channel region 16 (equivalent to the lower side of the arrow denoted by Lch), that is, near the channel located at the lower end of the pn junction formed by the $p^+$ region 12 and the $n^+$ layer 13. When the $p^+$ region 12 is formed more deeply and the lower end of the pn junction is formed inside the $n^-$ drift layer, an anode side of the channel 16 has an $n^+$ type and a cathode side thereof has an $n^-$ type. Since the expansion of the depletion layer is larger in the $n^-$ type than the $n^+$ type, the voltage required for removing the overlap of the depletion layers near the bottom of the channel is increased compared with the case where the whole channel region 16 has a high-concentration $n^+$ type. On the other hand, in the present invention, the bottom of the channel region 16 is disposed on the anode electrode side compared with the interface between the $n^-$ drift layer 11 and the $n^+$ layer 13, and therefore, the field-effect diode of the present invention can achieve both the high breakdown voltage and the low start-up voltage at the same time.

Figure 2A:
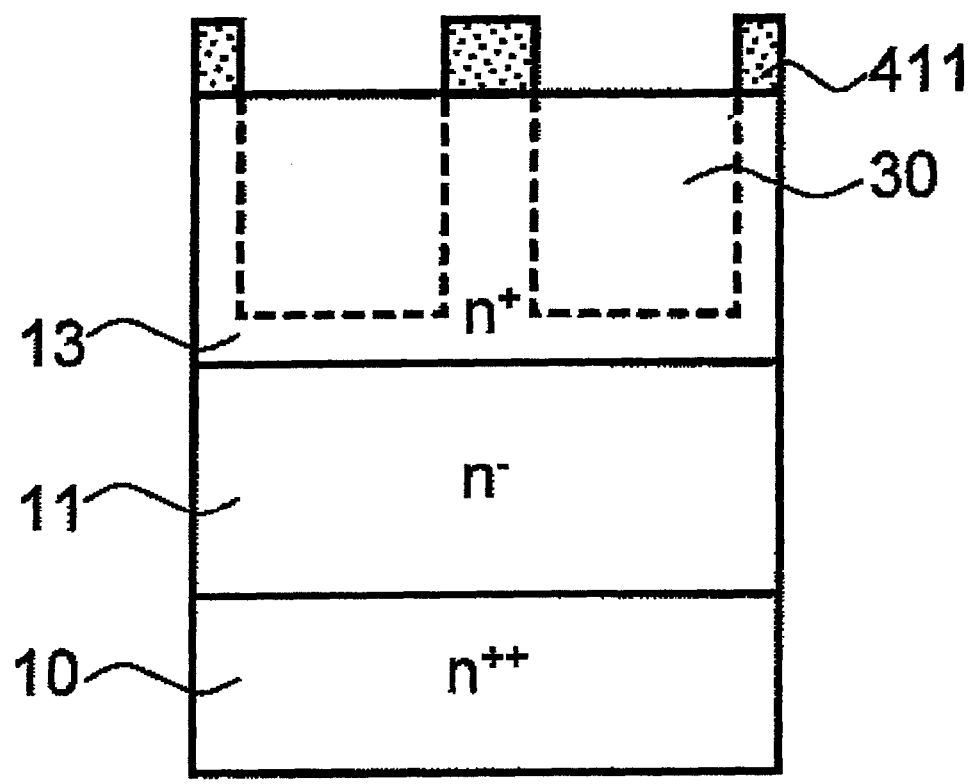
FIG. 2A is an explanatory diagram showing a manufacturing process of the diode shown in FIG. 1.
Figure 2C:
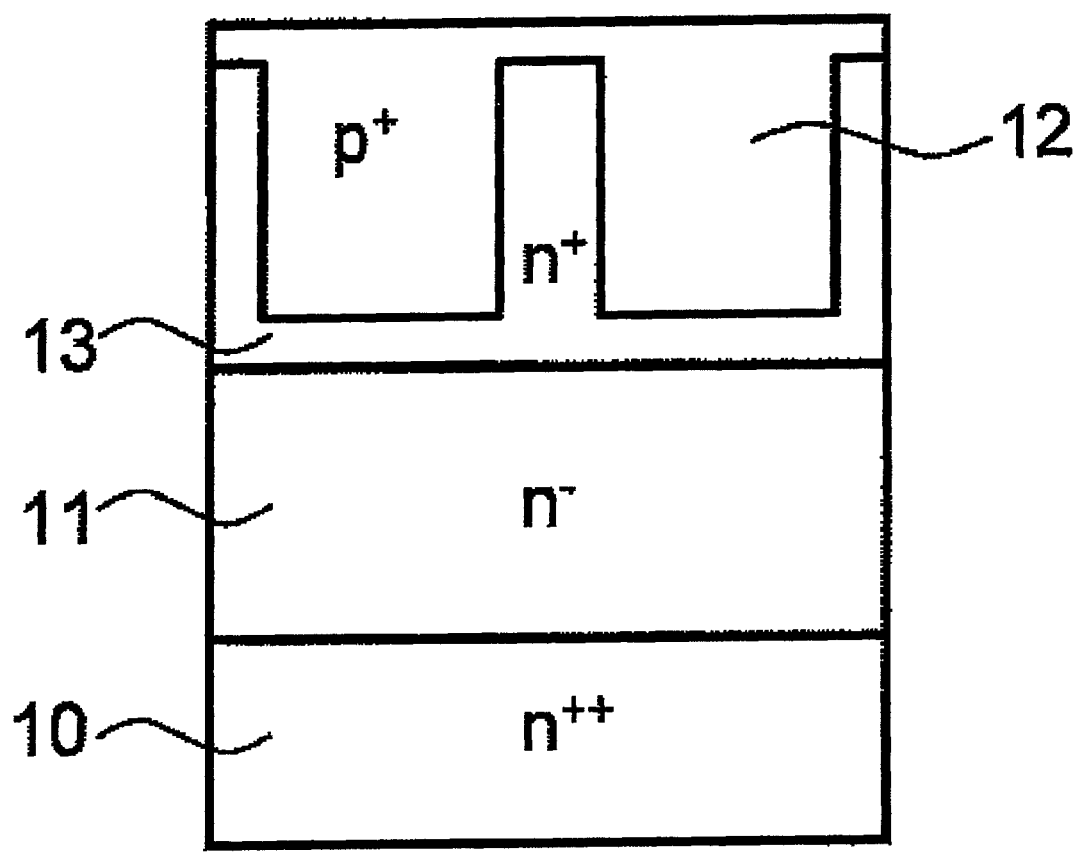
FIG. 2C is an explanatory diagram showing the manufacturing process of the diode shown in FIG. 1.
Figure 2D:
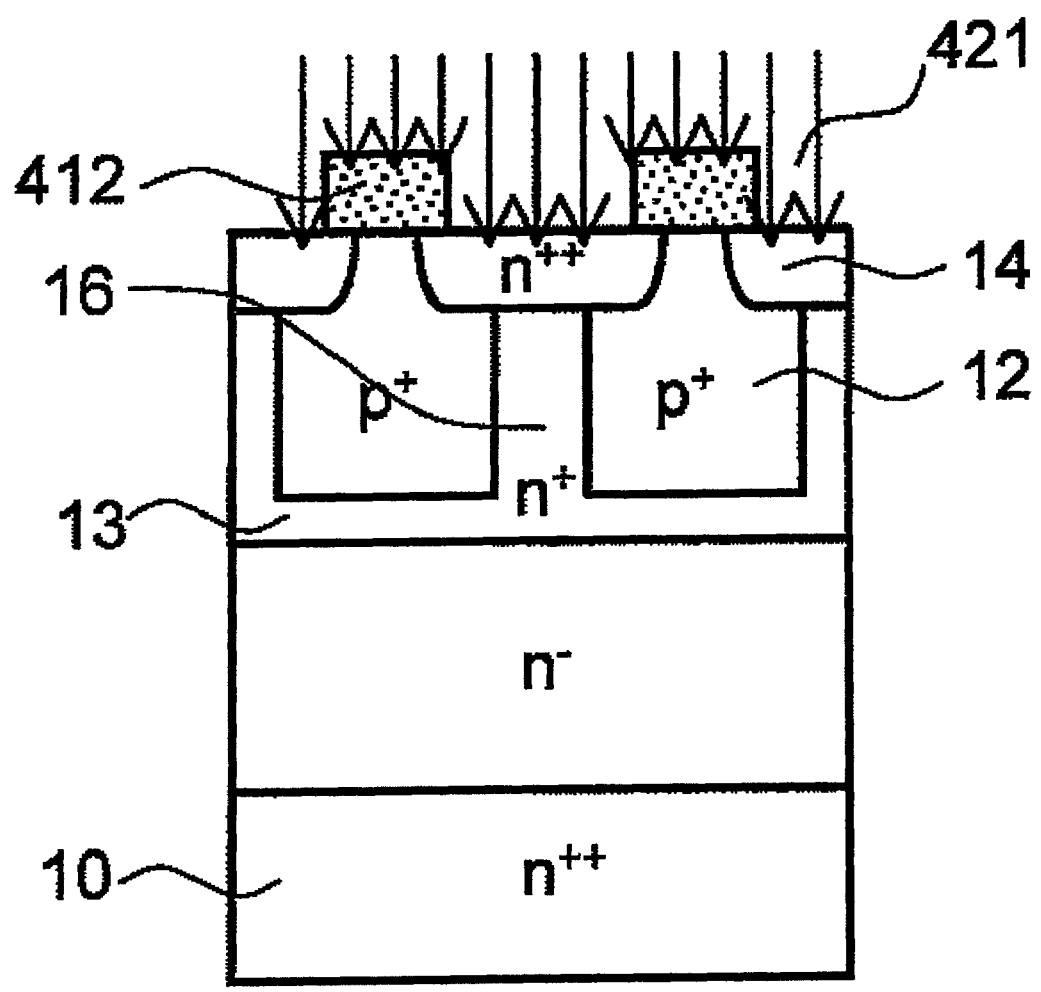
FIG. 2D is an explanatory diagram showing the manufacturing process of the diode shown in FIG. 1.

The process for manufacturing the diode structure will be schematically described below with reference to FIG. 2A to FIG. 2D. In the present embodiment, for achieving the breakdown voltage of 600 V or higher, an $n^-$ layer 11 with a nitrogen concentration of $1\times10^{16}$ cm$^{-3}$ and a thickness of 6.0 µm and an $n^+$ layer 13 with a nitrogen concentration of $1.5\times10^{17}$ cm$^{-3}$ and a thickness of 1.5 µm are epitaxially grown on the n type 4H-SiC substrate 10 with an impurity concentration of $2\text{--}5\times10^{20}$ cm$^{-3}$, a CVD-SiO$_2$ film 411 is formed thereon, and then, a mask pattern for forming trenches is formed based on the pattern formed by lithography (FIG. 2A). After forming trenches 30 with a depth of 1.2 µm by dry etching, the mask pattern 411 is removed, and a $p^+$ layer 121 whose concentration is adjusted to $2\times10^{18}$ cm$^{-3}$ by using Al as a dopant is epitaxially grown to fill the trenches. By this means, the distance d between the lower end of the pn junction between the $p^+$ region 12 and the $n^+$ layer 13 and the interface between the $n^+$ layer 13 and the $n^-$ drift layer 11 is set to 0.3 µm (FIG. 2B). FIG. 2C shows the process of forming the $p^+$ region 12 by etching back the $p^+$ layer 121 by the CMP. In the present embodiment, the $p^+$ layer 121 is etched back so as not to completely expose the $n^+$ layer 13 and 0.05 µm of the $p^+$ layer 121 is left. This is for the purpose of preventing the shortage of the length of the channel formed in the following process due to the overetching, but since the channel length can be adjusted in the next process, the overetching of the $n^+$ layer 13 of about 0.1 µm is permissible. FIG. 2D shows a process of forming the region 14 to be the $n^{++}$ anode. After the etching back, a CVD-SiO$_2$ film 412 is formed, and then, a mask pattern for ion implantation is formed based on the pattern formed by the lithography and nitrogen 421 is ion-implanted. The implantation is carried out by multi-step implantation of 25 to 110 keV so that the interface between the $n^+$ layer 13 and the $n^{++}$ anode 14 is located at 0.25 µm from the surface. The surface concentration of the $n^{++}$ anode 14 is $2\times10^{20}$ cm$^{-3}$. After the implantation, the mask pattern 412 is removed and the thermal activation treatment is carried out at 1700° C., and through the process of forming electrodes not shown, the diode of the present invention shown in FIG. 1 is completed. In the present embodiment, the channel width Wch is 0.11 µm. Ni is used for the cathode electrode 10 and the anode electrode. Furthermore, boron (B) may be used as the impurity of the $p^+$ region 12 and phosphorus (P) may be used as the impurity of the $n^{++}$ anode 14.

Figure 3:
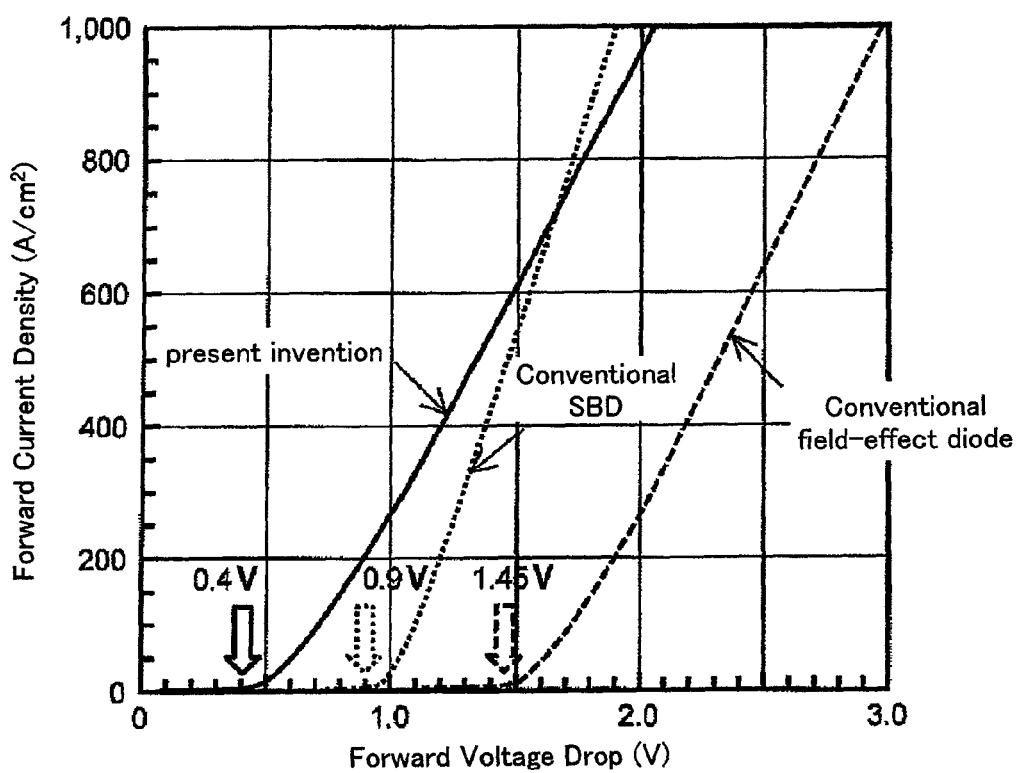
FIG. 3 is a diagram showing current-voltage characteristics of the diode of the present invention and conventional diodes.

FIG. 3 is a diagram of forward I-V characteristics. For comparison, FIG. 3 also shows the characteristics of a conventional Schottky barrier diode (hereinafter, referred to as SBD) using Ti for a Schottky electrode and the characteristics of a conventional field-effect diode disclosed in the Patent Document 1. Since the margin of 10% or more is necessary for ensuring the rating in general, those having the breakdown voltage of 650 V are compared because this is the comparison of diodes having the breakdown voltage of 600 V. The dotted line shows the conventional SBD and it has a start-up voltage of 0.9 V, and therefore, the current density is 20 to 30 A/cm$^3$ or lower when used at the FVD of 1 V or lower. On the other hand, the broken line shows the case of the conventional field-effect diode (drift layer impurity concentration and channel region impurity concentration are $2\times10^{16}$ cm$^{-3}$). The start-up voltage thereof is 1.45 V and this is the result higher than that of the conventional SBD. This is because the channel width is narrowed in order to suppress the impact ionization near the bottom of the channel, and as a result, the voltage for removing the overlapping of the depletion layers inside the channel is increased. It seems that the goal of the field-effect diode which is the reduction of the start-up voltage is not achieved, but since the start-up voltage is about 2.5 V when the pn diode is fabricated with SiC, the effect of reducing the start-up voltage can be sufficiently achieved when compared with that.

Meanwhile, the field-effect diode of the present invention shown by the solid line can achieve the start-up voltage of 0.4 V and the current density of 250 A/cm$^2$ can be obtained under the condition of the FVD of 1 V or lower. According to this result, the conduction loss is smaller than the pn diode of Si, and the diode capable of reducing not only the recovery loss but also the conduction loss can be provided by the application of the present invention. This is the result of forming the channel region so as to have an impurity concentration higher than that of the drift region and setting the distance d between the lower end of the pn junction formed between the p$^+$ region 12 and the n$^+$ layer 13 and the interface between the n$^+$ layer 13 and the n$^-$ drift layer 11 to 0.3 μm. When the distance d exceeds 0.5 μm, the electric field in the n$^+$ layer 13 near the bottom of the n$^+$ channel 16 is increased, and the impact ionization is likely to occur. Therefore, the distance d is desirably 0.2 μm or larger and 0.5 μm or smaller.

Figure 4A:
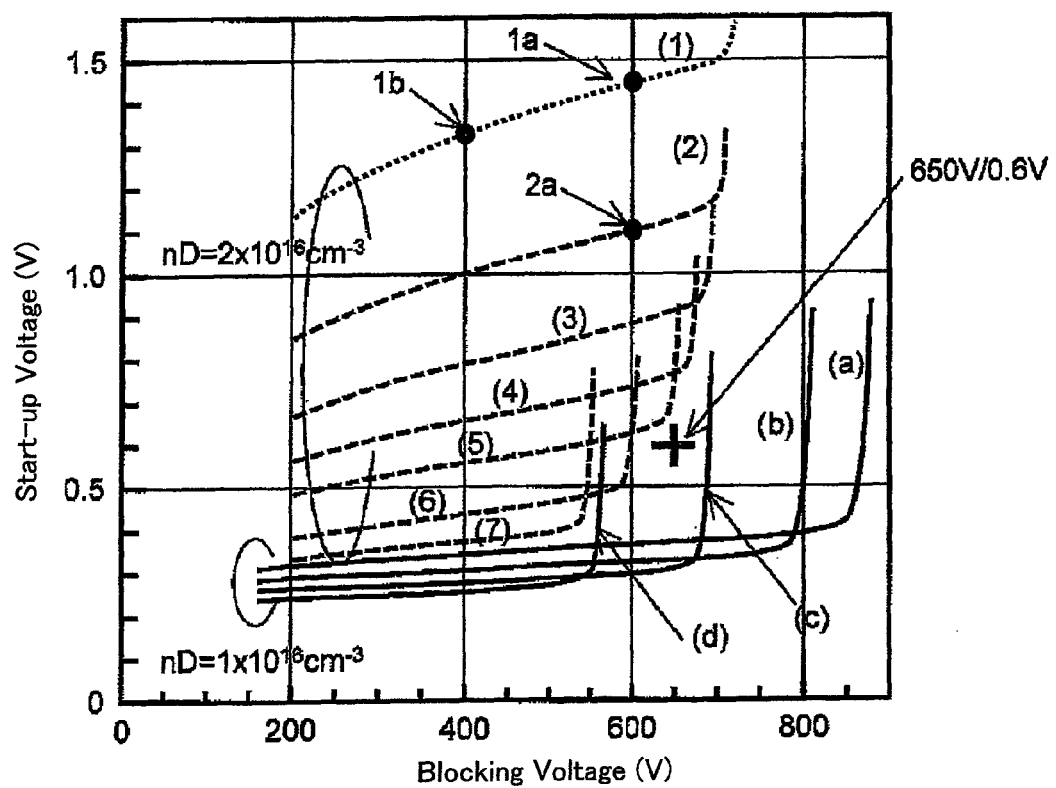
FIG. 4A is a diagram showing the relation between a blocking voltage and a start-up voltage.

Next, the impurity concentration of the n$^+$ layer 13 and the n$^-$ drift layer 11 will be described with reference to FIG. 4A. FIG. 4A shows the results of the study for the relation between the start-up voltage and the blocking voltage obtained by simulation. In FIG. 4A, the dotted line (1) shows the characteristics of the conventional field-effect diode, in which both the drift layer concentration and the channel concentration are 2×10$^{16}$ cm$^{-3}$ and the channel width Wch is taken as a parameter. When Wch is increased, the blocking voltage moves on the dotted line to the lower side. An example will be described on the basis of the point 1a (blocking voltage of 600 V and start-up voltage of 1.46 V). Both the blocking voltage and the start-up voltage are lower at the point 1b than those at the point 1a, and this is because Wch is increased. More specifically, since the blocking performance is reduced by increasing Wch, the blocking voltage is lowered, and since the potential inside the channel is also reduced, the start-up voltage is also lowered. For these reasons, the blocking voltage moves to the lower side on the same dotted line when Wch is increased. Even when the blocking voltage is low (for example, 200 V), the start-up voltage is higher than 1 V. The dotted lines (2) to (7) respectively show the results in the case where the channel concentration is gradually increased according to the present invention under the condition of the drift layer concentration of 1×10$^{16}$ cm$^{-3}$. The channel concentration of each case is 3×10$^{16}$ cm$^{-3}$ in (2), 4×10$^{16}$ cm$^{-3}$ in (3), 5×10$^{16}$ cm$^{-3}$ in (4), 6×10$^{16}$ cm$^{-3}$ in (5), and 8×10$^{16}$ cm$^{-3}$ in (6) and 1×10$^{17}$ cm$^{-3}$ in (7). It can be understood from these results that the reduction effect of the start-up voltage can be achieved by increasing the channel concentration. When compared at the breakdown voltage of 650 V, the start-up voltage of 0.65 V at the channel concentration of 6×10$^{16}$ cm$^{-3}$ in (5) is lowest. It is difficult to achieve even the characteristics equivalent to those of the Si-pn diode (blocking voltage of 650 V and start-up voltage of 0.6) shown by "+" in FIG. 4A. Note that, even when the blocking voltage is the same, if the channel concentration differs, Wch also differs. For example, although the blocking voltage is 600 V at the points 1a and 2a, since the channel concentration at 2a is twice as high as that of 1a, Wch at 2a has a value smaller than that at 1a.

Figure 4B:
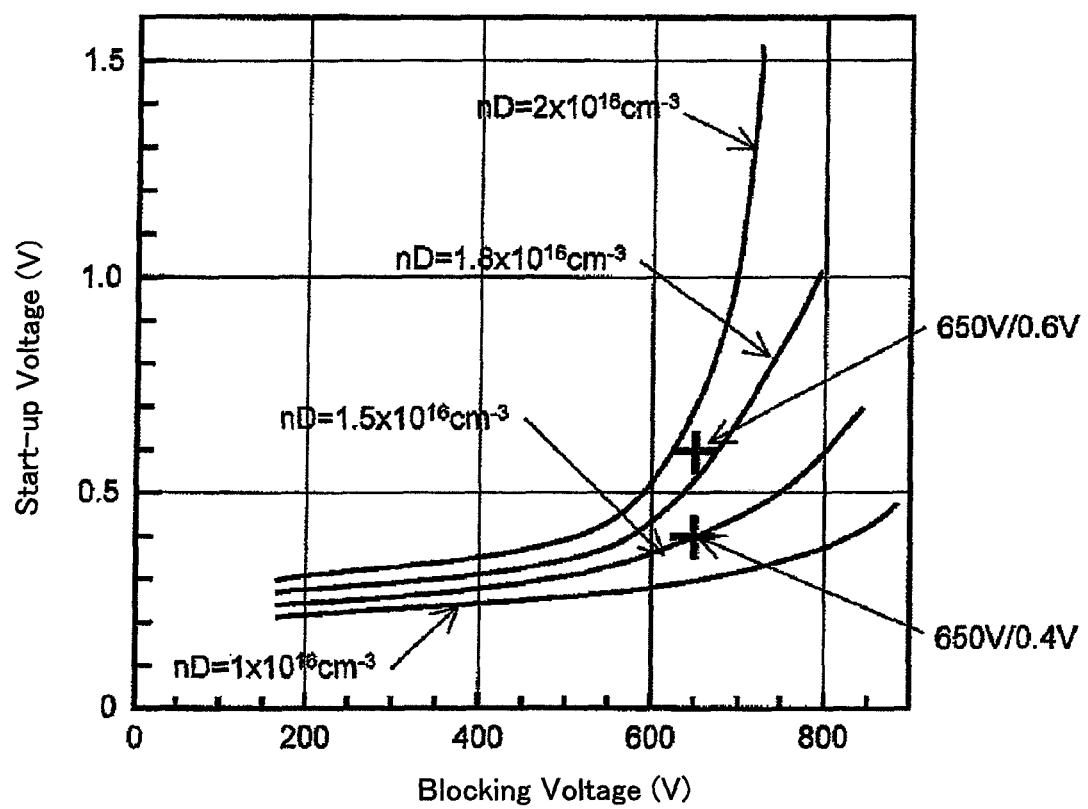
FIG. 4B is a diagram showing the relation between a blocking voltage and a start-up voltage.

On the other hand, it can be understood that both the high blocking voltage and the low start-up voltage can be achieved at the same time in the case where the drift layer concentration is halved to 1×10$^{16}$ cm$^{-3}$. In FIG. 4A, the solid lines (a) to (d) respectively show the results in the case where the channel concentration is gradually increased. The channel concentration of each case is 1×10$^{17}$ cm$^{-3}$ in (a), 1.2×10$^{17}$ cm$^{-3}$ in (b), 1.5×10$^{17}$ cm$^{-3}$ in (c) and 1.8×10$^{17}$ cm$^{-3}$ in (d). In the case of the condition (c), the blocking voltage is 650 V and the start-up voltage is 0.4 V, and the start-up voltage lower than that of the Si-pn diode can be achieved while ensuring the blocking voltage. From the results above, the concentration of the drift layer is desirably 2×10$^{16}$ cm$^{-3}$ or lower which is the concentration capable of achieving the breakdown voltage in the case of the diode rated at 600 V. For clarifying the reduction effect of the drift layer concentration, FIG. 4B shows the relation between the blocking voltage and the start-up voltage with using the drift layer concentration as a parameter. Each curve is the combination of Wch and the channel concentration by which the start-up voltage at each drift layer concentration is minimized and shows the limit thereof. For example, in the case where the drift layer concentration nD is 2×10$^{16}$ cm$^{-3}$, it corresponds to an envelope curve obtained by connecting minimum values of the dotted line (1) and the broken lines (2) to (7) shown in FIG. 4A. From FIG. 4B, the drift layer concentration has to be set to 1.8×10$^{16}$ cm$^{-3}$ or lower in order to achieve both the blocking voltage of 650 V and the start-up voltage of 0.6 V equivalent to that of the Si-pn diode.

An object of the present invention is to suggest the structure capable of reducing the start-up voltage as low as possible, desirably to be lower than that of the Si-pn diode. From this viewpoint, the start-up voltage of 0.4 V or lower can be achieved by setting the drift layer concentration to 1.5×10$^{16}$ cm$^{-3}$ or lower, and this meets the object of the present invention. However, it is necessary to pay attention to the fact that the resistance of the drift layer is increased when the drift layer concentration is reduced. When the current-voltage characteristics are compared in FIG. 3, the diode of the present invention has a smaller slope than the conventional SBD. Therefore, the reduction of the drift layer concentration has its lower limit. In the case of the present invention shown in FIG. 3, the drift layer concentration is 1×10$^{16}$ cm$^{-3}$, but the current density at the point where the current-voltage characteristics of the present invention intersect with those of the conventional SBD is 700 A/cm$^2$ and is higher than 400-500 A/cm$^2$ which is the rated current density of the diode with the breakdown voltage of 600 V using SiC. More specifically, the diode of the present invention has lower loss over the whole region of the current density used normally. Since the resistance is increased when the drift layer concentration is reduced, the current density at the point where the current-voltage characteristics of the present invention intersect with those of the conventional SBD is lowered. The condition for intersecting at the rated current density is the slope of 80%, of the present invention, and this corresponds to the drift layer concentration of 8×10$^{15}$ cm$^{-3}$. Furthermore, although it differs depending on operation conditions, since the current value which provides an indication of the conduction loss is generally half to one-third of the rated value, when the current density of the intersection is higher than 250 A/cm$^2$, it means that the loss reduction effect of the present invention is exerted. This corresponds to that the slope may be halved compared with the current-voltage characteristics of the present invention shown in FIG. 3. More specifically, the drift layer concentration can be reduced to 5×10$^{15}$ cm$^{-3}$ which is the half of the present invention in FIG. 3. From the foregoing, the impurity concentration of the drift layer for achieving the object of the present invention is preferably in the range from $5\times10^{15}$ cm$^{-3}$ to $1.8\times10^{16}$ cm$^{-3}$, and more preferably in the range from $8\times10^{15}$ cm$^{-3}$ to $1.5\times10^{16}$ cm$^{-3}$.

Furthermore, with respect to the channel concentration, the condition (c): $1.5\times10^{17}$ cm$^{-3}$ is most preferable for the object of the present invention from FIG. 4A. When focused only on the start-up voltage, since the start-up voltage cannot be reduced to lower than 0.6 V when the concentration is lower than that of the condition (6): $8\times10^{16}$ cm$^{-3}$, this is the lowest channel concentration. On the other hand, in the case of the condition (d): $1.8\times10^{17}$ cm$^{-3}$, the start-up voltage reduction effect is approximately the same as that of the condition (c). Although the problem that the blocking voltage of 550 V or higher cannot be obtained can be solved by reducing the drift layer concentration to $1\times10^{16}$ cm$^{-3}$ or lower, this is not preferable because it is accompanied with the increase of the drift layer resistance. Therefore, $1.8\times10^{17}$ cm$^{-3}$ is the highest channel concentration in view of the drift layer resistance. Accordingly, the impurity concentration of the channel region is in the range from $8\times10^{16}$ cm$^{-3}$ to $1.8\times10^{17}$ cm$^{-3}$.

Figure 5:
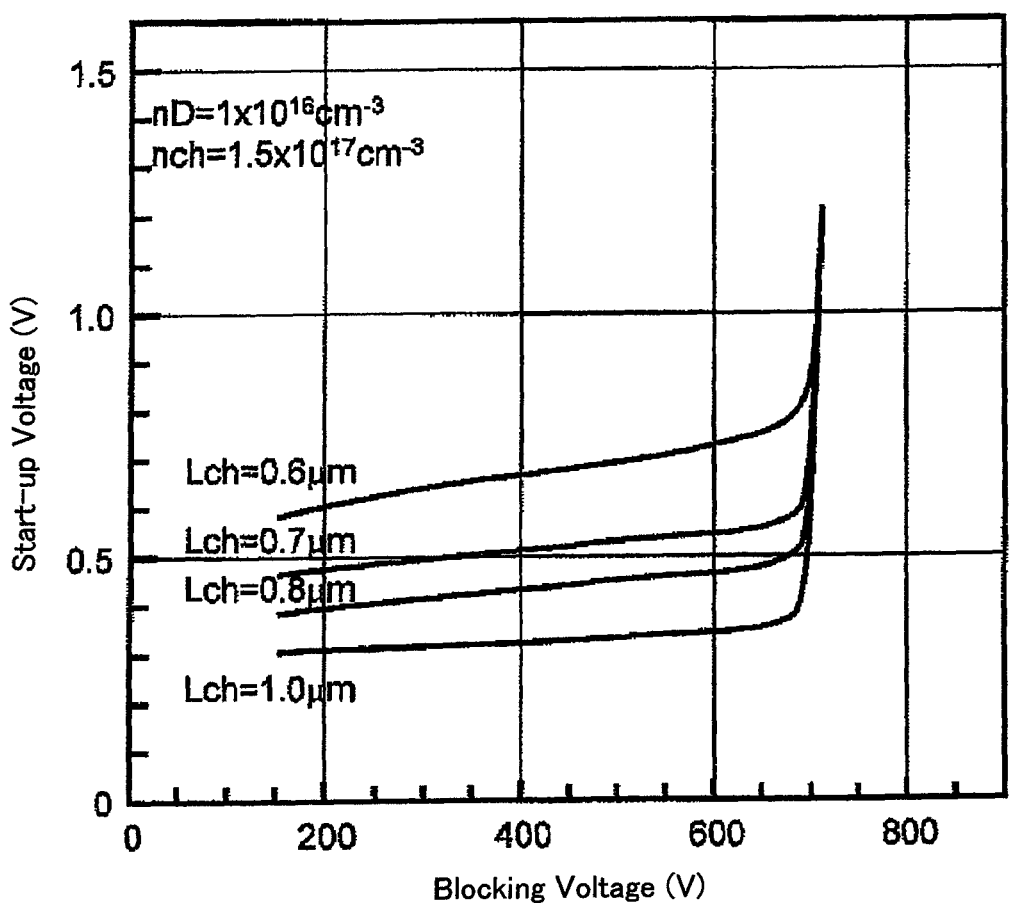
FIG. 5 is a diagram showing the relation between a blocking voltage and a start-up voltage.
Figure 6:
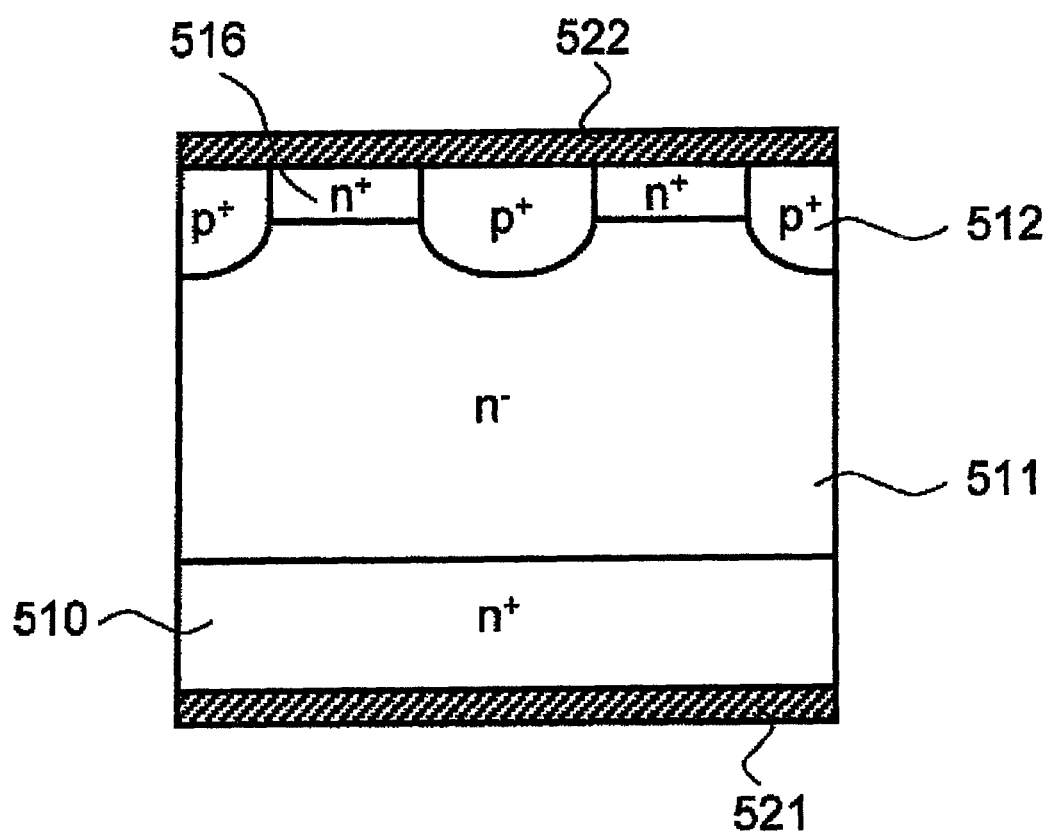
FIG. 6 is a schematic cross-sectional view of a conventional field-effect diode.

FIG. 5 shows the result of the study about the channel length Lch. In the present embodiment, Lch is set to 1.0 µm, but the start-up voltage can be reduced to lower than the start-up voltage (0.6 V) of the Si-pn diode even when the channel length is shorter than 1.0 µm. However, in the case of the diode rated at 600 V, the start-up voltage is higher than that of the Si-pn diode when the channel length is 0.6 µm. This is because when the channel length Lch is shortened, it becomes easy to pass through the potential barrier formed by the depletion layer in the blocking state, and Wch has to be reduced in order to suppress the phenomenon of increasing the channel leakage and thus the start-up voltage is increased. Therefore, the channel length Lch is desirably 0.7 µm or larger.

Second Embodiment

Figure 7:
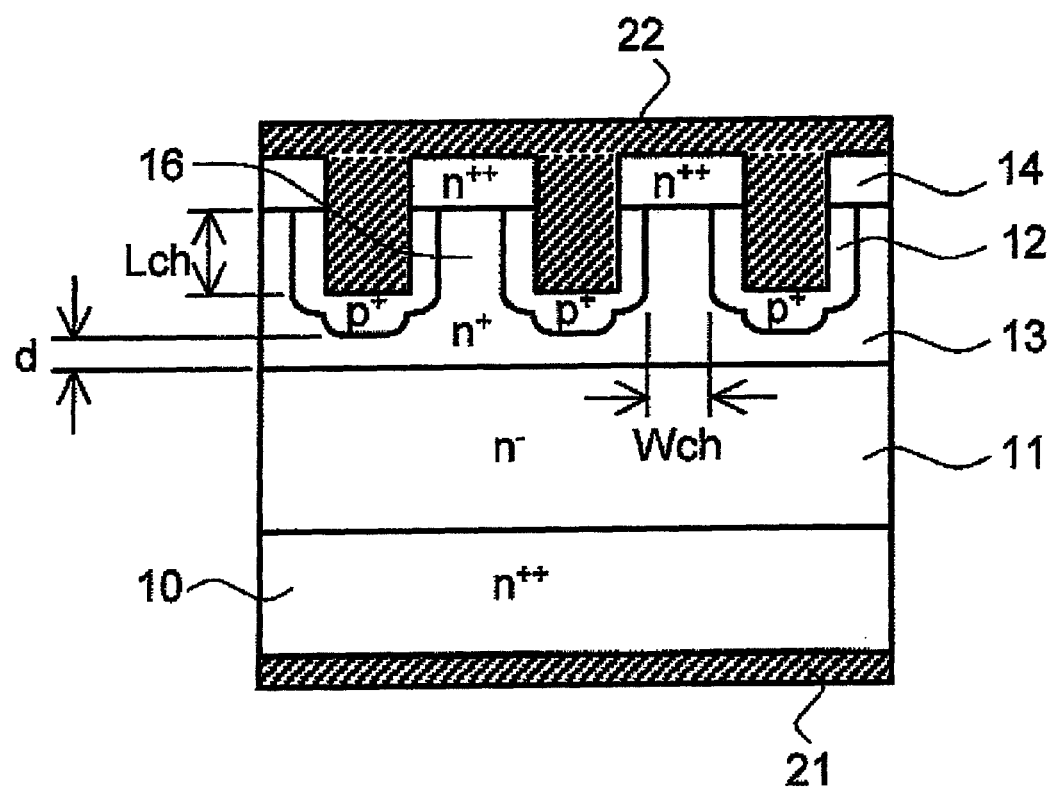
FIG. 7 is a schematic cross-sectional view of a diode showing the second embodiment of the present invention.

The case where the p$^+$ region is formed by the epitaxial growth has been described in the first embodiment, but the p$^+$ region may be formed by ion implantation as an easier method. FIG. 7 is a schematic cross-sectional view of a diode for describing the second embodiment of the present invention. The reference numerals used in FIG. 7 denote the same components as those of FIG. 1, and 21 denotes a cathode electrode, 10 denotes an n$^{++}$ cathode layer which is a 4H-SiC substrate, 11 denotes an n$^-$ drift layer, 12 denotes a p$^+$ region, 13 denotes an n$^+$ layer, 14 denotes an n$^{++}$ anode region, 16 denotes an n$^+$ channel region and 22 denotes an anode electrode. Further, Wch denotes a channel width, and the width is almost uniform over a channel length Lch. Furthermore, the lower end of the p$^+$ region 12 is in contact with the n$^+$ layer 13 and is separated from the n$^-$ layer 11 by a distance d in this structure.

Figure 8A:
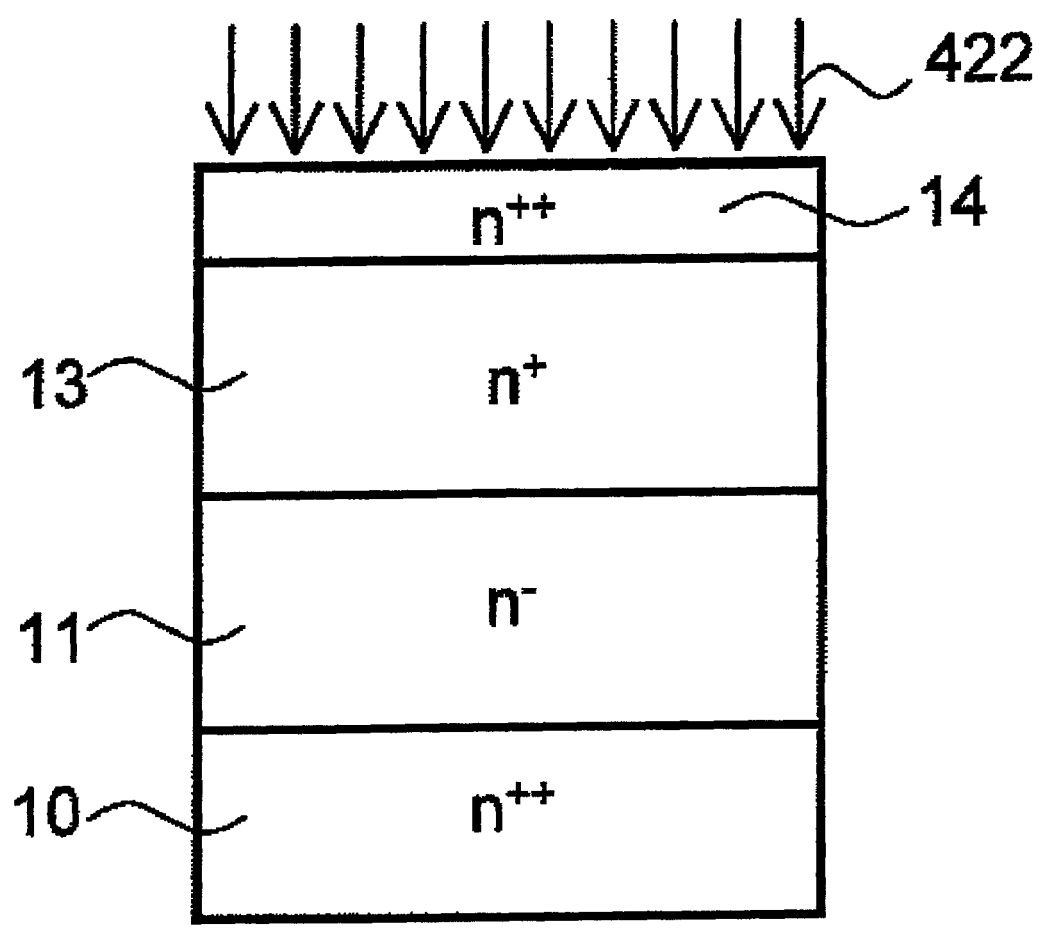
FIG. 8A is an explanatory diagram showing a manufacturing process of the diode shown in FIG. 7.
Figure 8B:
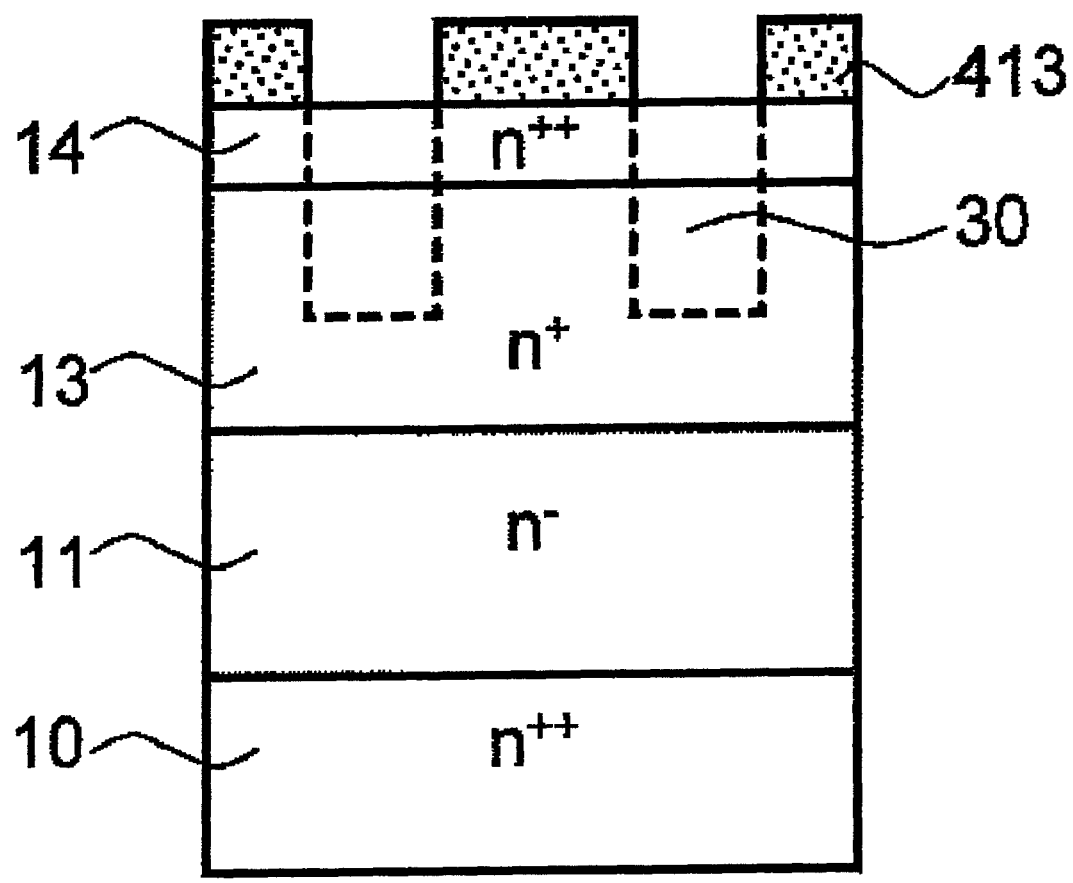
FIG. 8B is an explanatory diagram showing the manufacturing process of the diode shown in FIG. 7.
Figure 8C:
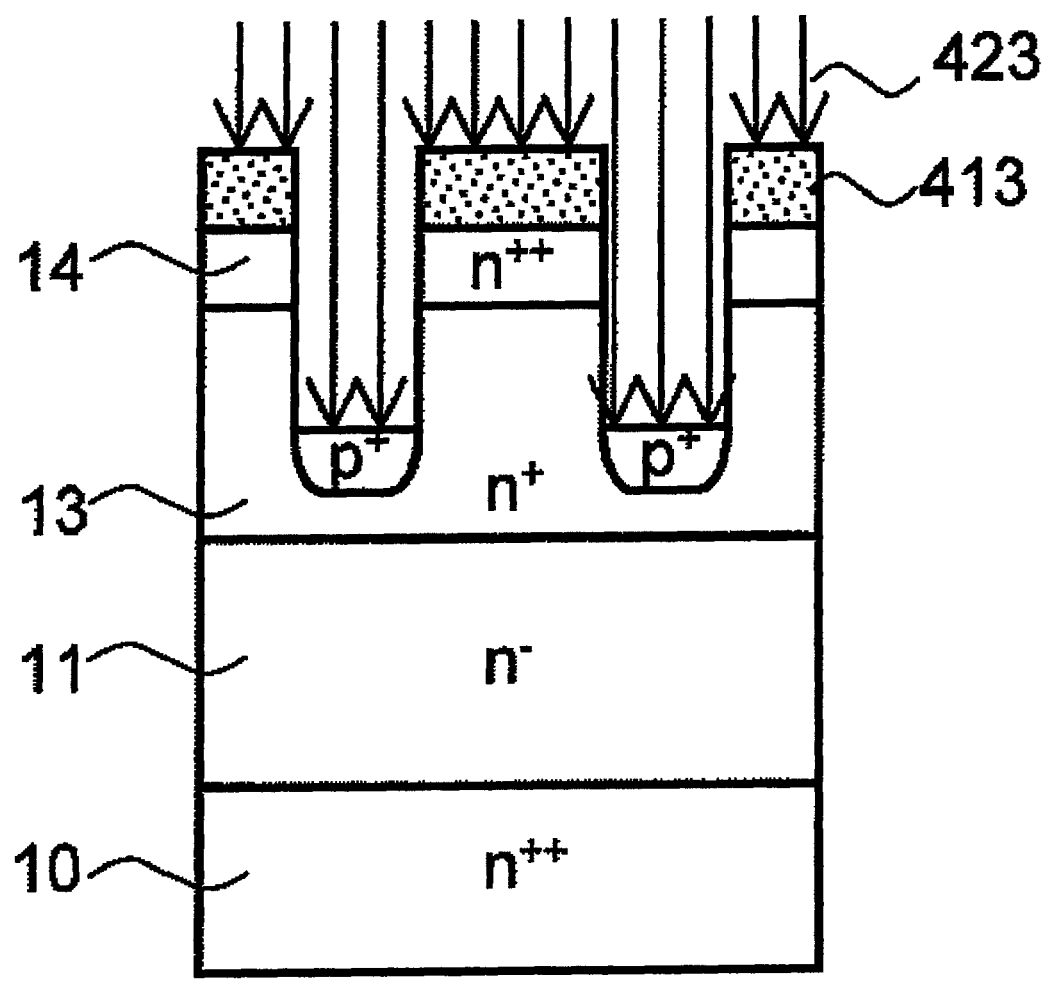
FIG. 8C is an explanatory diagram showing the manufacturing process of the diode shown in FIG. 7.
Figure 8D:
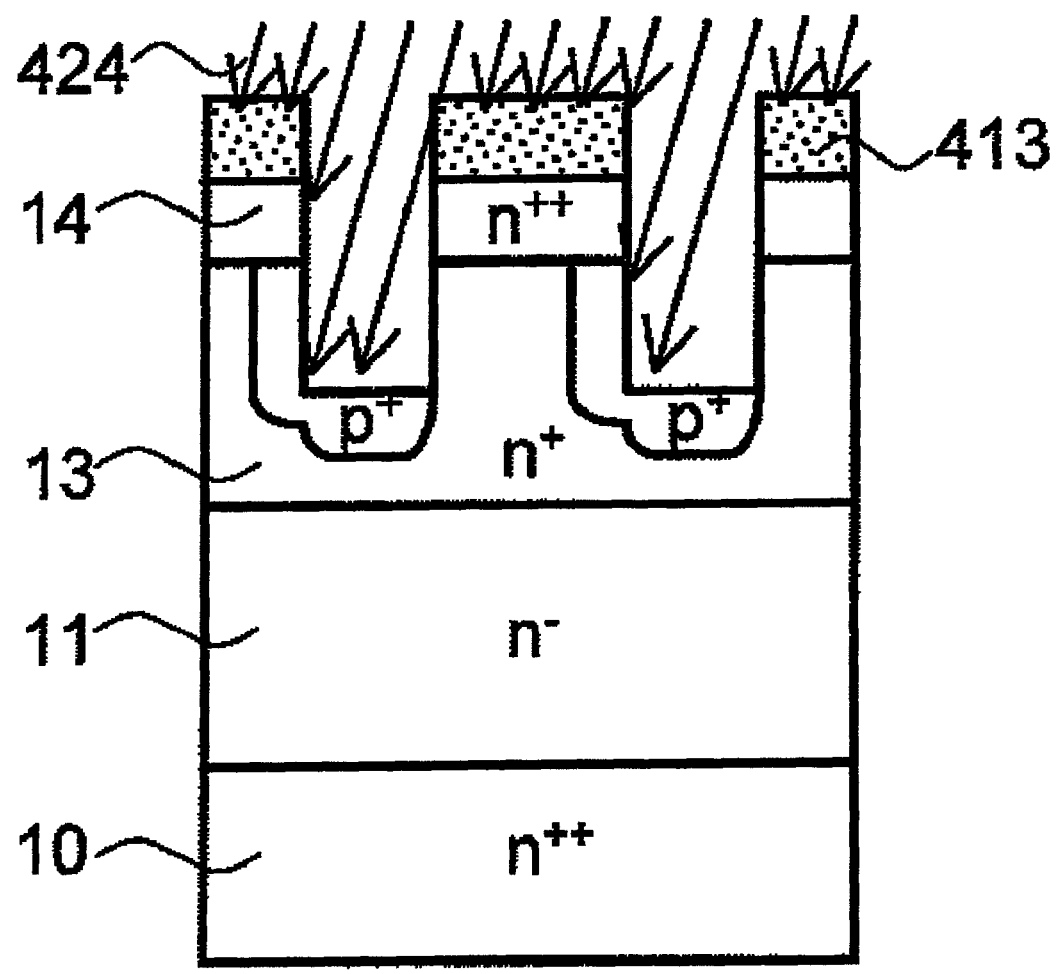
FIG. 8D is an explanatory diagram showing the manufacturing process of the diode shown in FIG. 7.
Figure 8E:
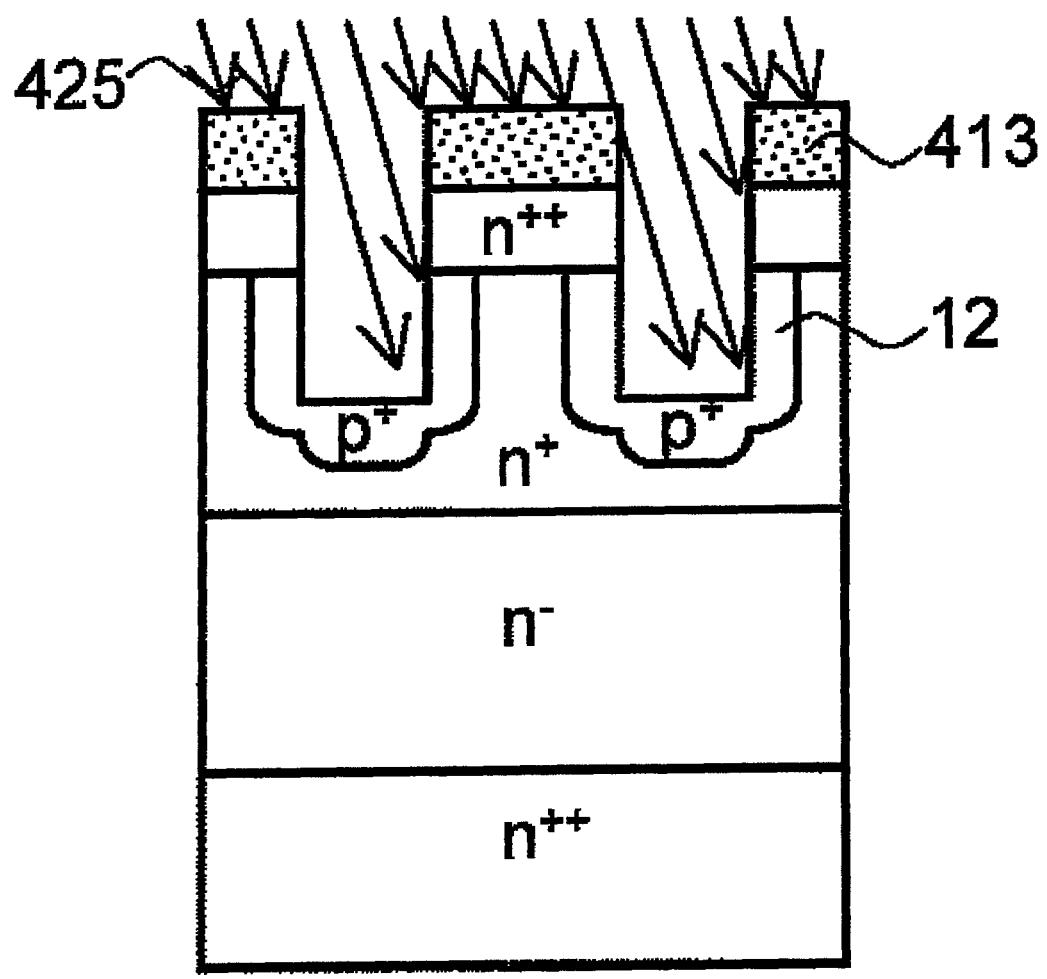
FIG. 8E is an explanatory diagram showing the manufacturing process of the diode shown in FIG. 7.

The process for manufacturing the diode structure will be schematically described below with reference to FIG. 8A to FIG. 8E. In the present embodiment, similarly to the first embodiment, for achieving the breakdown voltage of 600 V or higher, the n$^-$ layer 11 with a nitrogen concentration of $1\times10^{16}$ cm$^{-3}$ and a thickness of 6.2 µm and the n$^+$ layer 13 with a nitrogen concentration of $1.5\times10^{17}$ cm$^{-3}$ and a thickness of 1.8 µm are epitaxially grown on the high-concentration n type 4H-SiC substrate 10. Nitrogen 422 is then ion-implanted to the n$^+$ layer 13, thereby forming the n$^{++}$ anode region 14. The ion implantation conditions are the same as those of the first embodiment, and the n$^{++}$ anode region 14 is formed so that the interface with the n$^+$ layer 13 is located at 0.25 µm from the surface. Note that, although the n$^{++}$ anode region 14 is formed by the ion implantation in the present embodiment, it can be formed also by the epitaxial growth (FIG. 8A). After forming a CVD-SiO$_2$ film 413 on the n$^{++}$ anode region 14, a mask pattern for forming trenches is formed based on the pattern formed by lithography (FIG. 8B). After forming the trenches 30 with a depth of 1.25 µm by dry etching, the mask pattern 412 is removed, and a p$^+$ region is formed by the ion implantation using Al 423 as a dopant. The implantation is carried out by multi-step implantation with the implantation energy of 20 to 60 keV so that the p$^+$ region at the bottom of the trench has the depth of 0.25 µm. By this means, the distance d between the lower end of the p$^+$ region 12 at the bottom of the trench and the interface between the n$^+$ layer 13 and the n$^-$ drift layer 11 is set to 0.3 µm (FIG. 8C). Subsequently, by the oblique ion implantation of Al 424, the p$^+$ regions are formed on both sidewalls of the trench (FIG. 8D and FIG. 8E). After the implantation, the mask pattern 413 is removed, and the thermal activation treatment is carried out at 1700° C., and through the process of forming electrodes though not shown, the diode of the present embodiment shown in FIG. 7 is completed. Note that Ni is used for the cathode electrode 10 and the anode electrode. Also in the present embodiment, the I-V characteristics shown by the solid line of FIG. 3 can be obtained, and the current density of 250 A/cm$^2$ can be achieved under the conduction of the start-up voltage of 0.4 V and the FVD of 1 V or lower.

Third Embodiment

Next, the structure in which the field-effect diode of the present invention and a switching element are combined will be described. FIG. 9 is a circuit diagram for describing the third embodiment of the present invention. In the inverter used for the DC-AC conversion and the DC-DC converter, a diode for flywheel current in the switching operation is used as a pair in addition to a switching element for controlling the current. In the present embodiment, the device structure in which a SiC junction FET 51 is used as a switching element and is combined with a field-effect diode 50 according to the present invention will be described.

Figure 10:
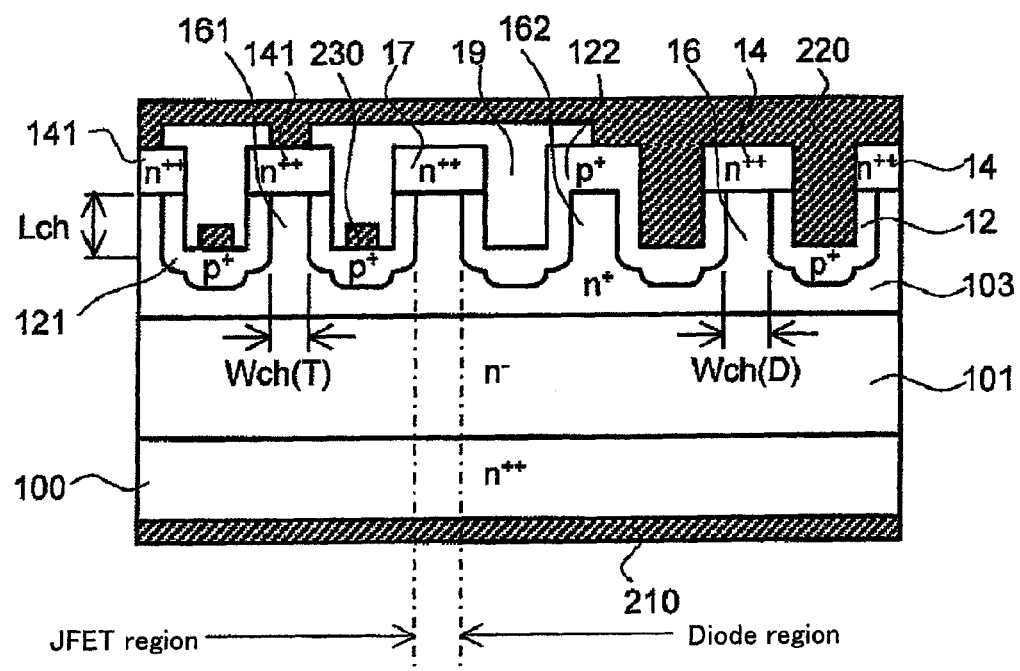
FIG. 10 is a schematic cross-sectional view showing the structure in which the combination shown in FIG. 9 is realized on the same semiconductor substrate.

FIG. 10 schematically shows a cross-sectional structure of the device in which the junction FET 51 and the field-effect diode 50 are fabricated on the same substrate. The reference numeral 210 denotes a cathode electrode of the diode 50 functioning also as a drain electrode of the junction FET 51, 100 denotes an n$^{++}$ cathode layer functioning also as an n$^{++}$ drain layer, 101 denotes a shared n$^-$ drift layer, and 103 denotes a shared n$^+$ layer. The reference numeral 12 denotes a p$^+$ region of the diode, 121 denotes a p$^+$ gate region of the junction FET, 14 denotes an n$^{++}$ anode region, 141 denotes an n$^{++}$ source region, 16 denotes an n$^+$ channel region of the diode, 161 denotes an n$^+$ channel region of the junction FET, 230 denotes a gate electrode, and 220 denotes an anode electrode functioning also as a source electrode of the junction FET. The reference numeral 19 denotes an insulating film for electrically insulating the gate electrode 230 and the source electrode 220 of the junction FET. The reference numeral 17 denotes an n$^{++}$ region for separating the diode and the junction FET, and this is completely the same as the n$^{++}$ source region 141 and the n$^{++}$ anode region 14 and is formed at the same time with them. An n$^+$ channel 162 is present also below the n$^{++}$ region 17 though it does not directly contribute to the conduction. The width W thereof is designed to be larger than the width Wch (T) in order to prevent the current flow between the p$^+$ gate 121 and the p$^+$ region 12 (or 122) due to the change in the potential of the p$^+$ gate 121 of the junction FET or the potential of the p$^+$ region 12 of the diode.

Furthermore, in the diode region of FIG. 10, there is a part in which the p$^+$ layer is provided instead of the n$^{++}$ layer on the substrate surface and this is in contact with the anode electrode 220. This is because, when the n++ anode regions are all formed on the substrate surface in the structure of FIG. 10, a p+ region which is not in contact with the anode electrode 220 is formed and the p+ region becomes the floating electrode to cause the unstable operation.

The manufacturing method is almost the same as that of the second embodiment. After the ion implantation, the thermal activation treatment is carried out, and then the gate electrode 230 is selectively formed and the insulating film 19 is formed. In the process of forming a contact window to the n++ source, the insulating film is removed including the trench portion only in the diode part so as to form the anode electrode or source electrode 220 and the lower cathode electrode or drain electrode 210, thereby completing the structure shown in FIG. 10. In this manner, the diode with a low start-up voltage can be fabricated through the same process as the junction FET on the same substrate. The structure in which a Schottky diode is formed together with a junction FET on the same substrate has already been known, but in this case, the low start-up voltage cannot be achieved and the process of forming the Schottky electrode has to be added as described above. Meanwhile, since the junction FET and the diode with a low start-up voltage can be formed on the same substrate without additional process in the present embodiment, the high-performance device can be realized at low cost.

Furthermore, as an advantage of this structure, common channels are used in the diode and the junction FET, and the difference therebetween is the channel width. Since the gate voltage can be controlled unlike the diode and the high threshold voltage is desirable when the junction FET 51 is normally-off, the width Wch (T) has to be made narrower than the channel width Wch (D) of the diode.

Fourth Embodiment

Figure 11:
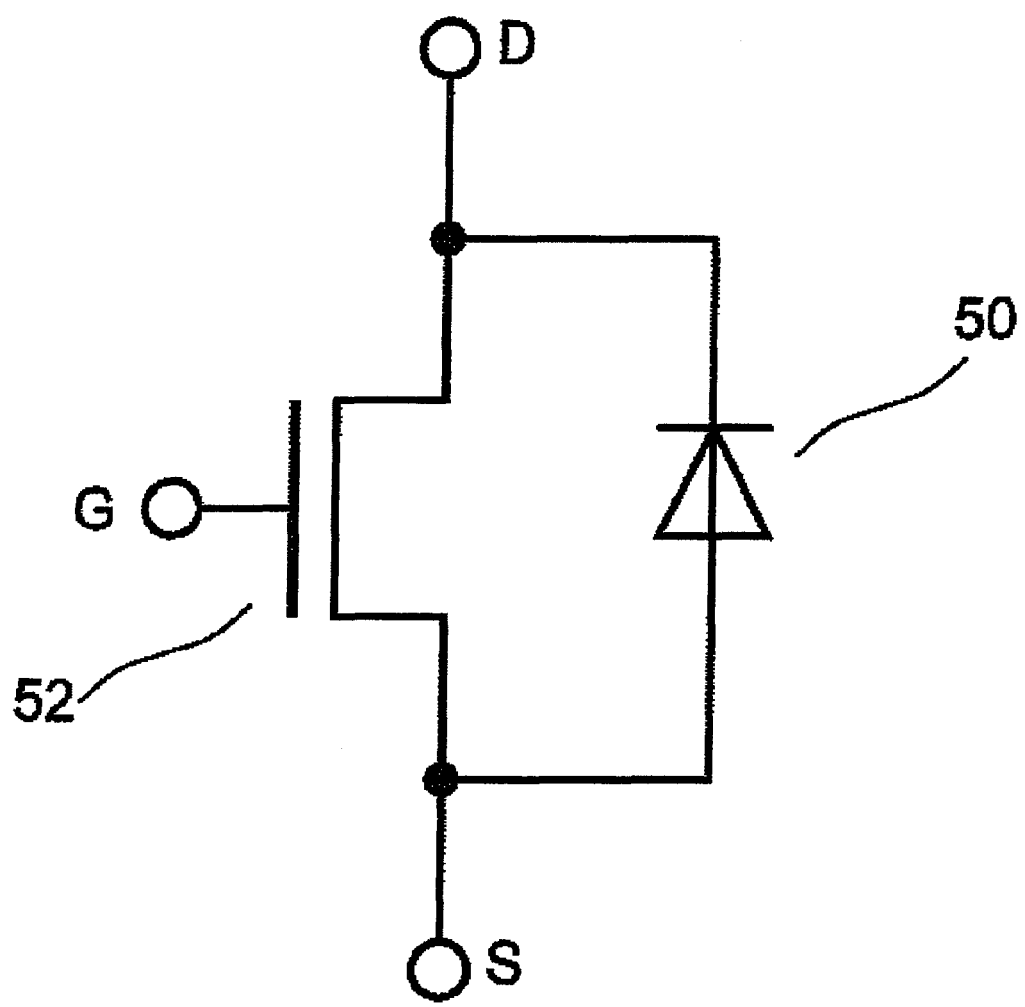
FIG. 11 is a circuit diagram showing the fourth embodiment of the present invention in which the diode of the present invention and a MOSFET are combined.
Figure 12:
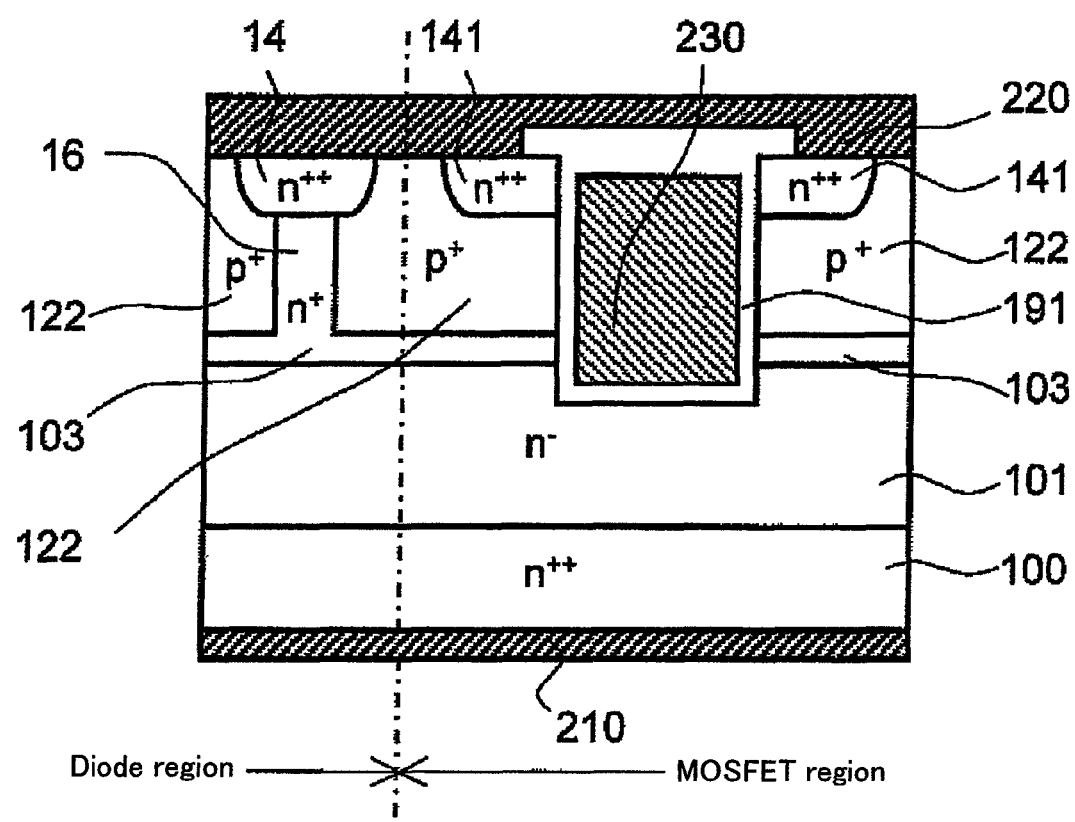
FIG. 12 is a schematic cross-sectional view showing the structure in which the combination shown in FIG. 11 is realized on the same semiconductor substrate.

FIG. 11 is a circuit diagram for describing the fourth embodiment, and this is an example in which a SiC-MOSFET 52 is used as a switching element for current control and the field-effect diode 50 of the present invention is combined therewith as a flywheel diode. FIG. 12 schematically shows a cross-sectional structure of the device in which two elements of FIG. 11 are fabricated on the same substrate. The reference numeral 210 denotes a cathode electrode of the diode 50 functioning also as a drain electrode of the MOSFET 52, 100 denotes an n++ cathode layer functioning also as an n++ drain layer, 101 denotes a shared n− drift layer, and 103 denotes a shared n+ layer. The reference numeral 122 denotes a p+ region of the diode functioning also as a p+ body region of the MOSFET, 14 denotes an n++ anode region, 141 denotes an n++ source region, 16 denotes an n+ channel region of the diode, 191 denotes a gate insulating film of the MOSFET, 230 denotes a gate electrode, and 220 denotes an anode electrode functioning also as a source electrode of the MOSFET.

Figure 13A:
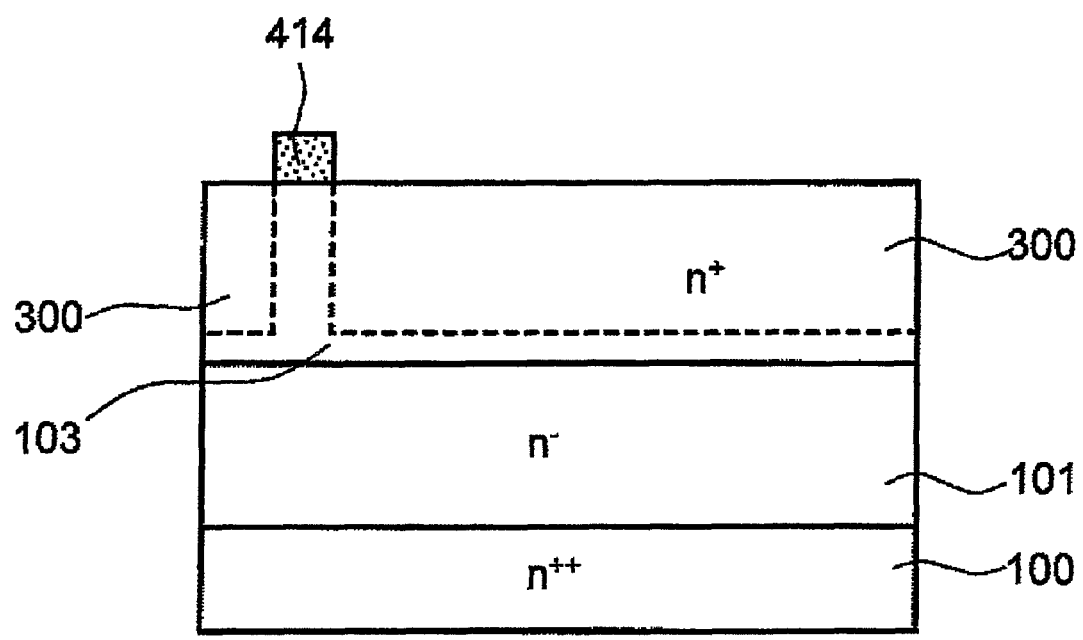
FIG. 13A is an explanatory diagram showing a manufacturing process of the semiconductor device shown in FIG. 12.
Figure 13B:
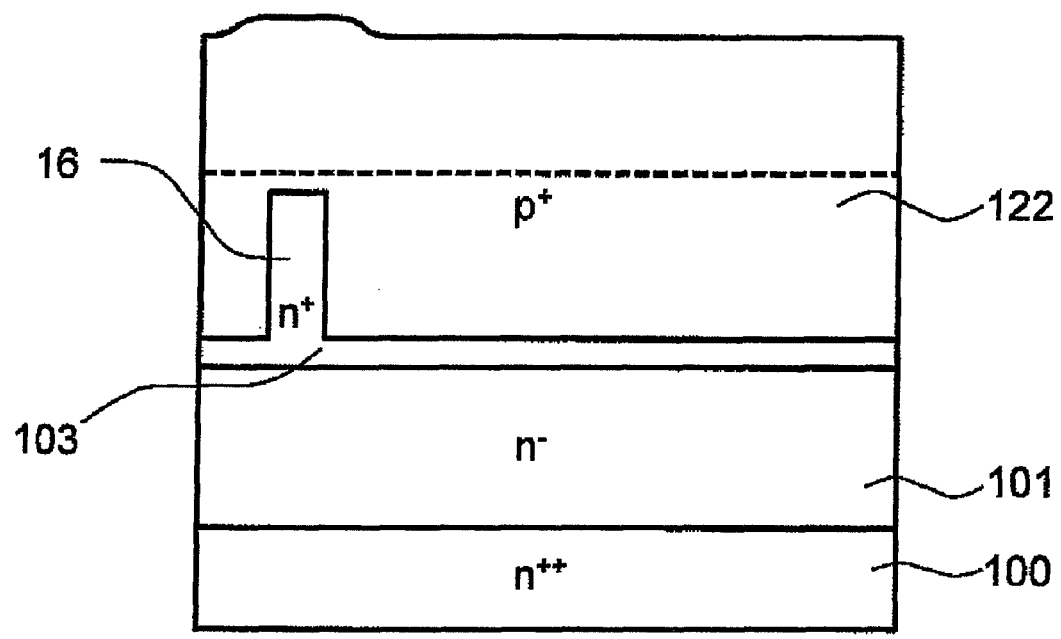
FIG. 13B is an explanatory diagram showing the manufacturing process of the semiconductor device shown in FIG. 12.
Figure 13C:
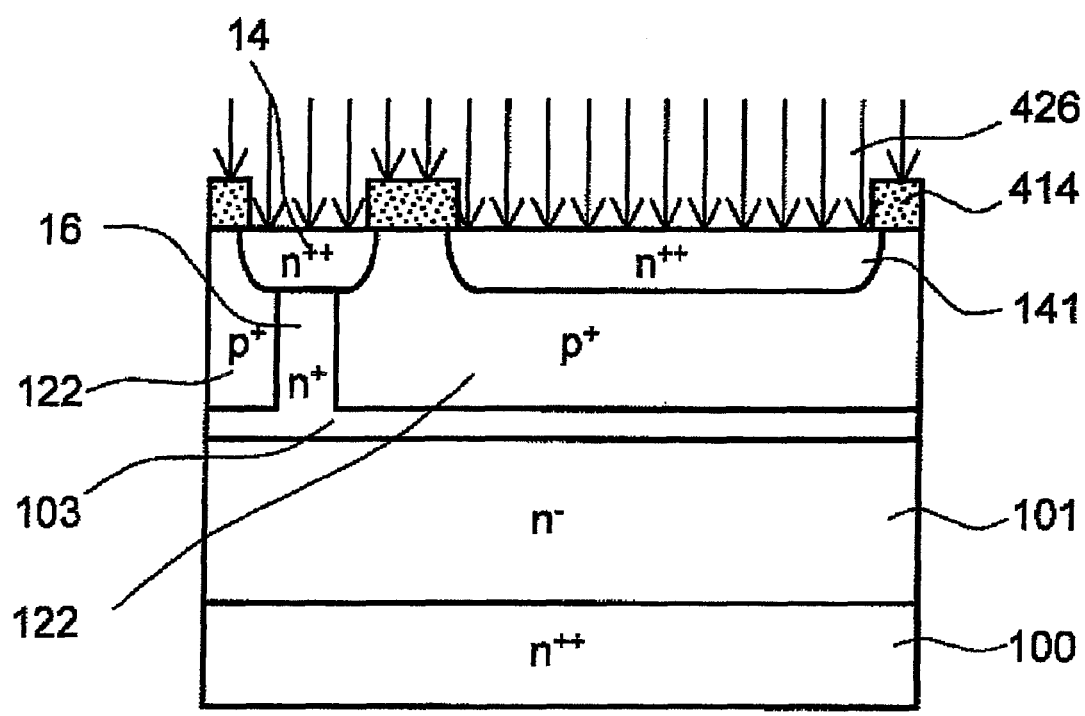
FIG. 13C is an explanatory diagram showing the manufacturing process of the semiconductor device shown in FIG. 12.
Figure 13D:
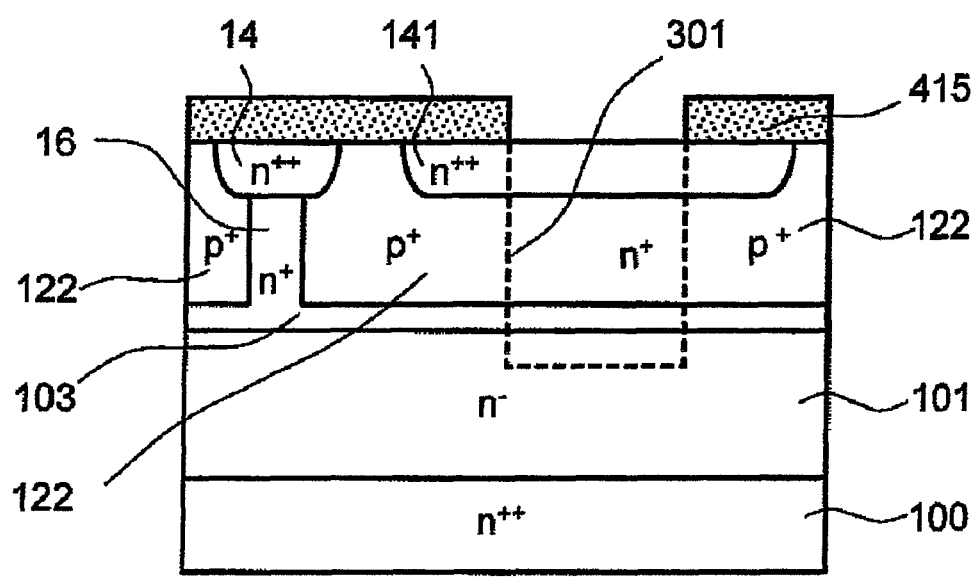
FIG. 13D is an explanatory diagram showing the manufacturing process of the semiconductor device shown in FIG. 12.
Figure 13E:
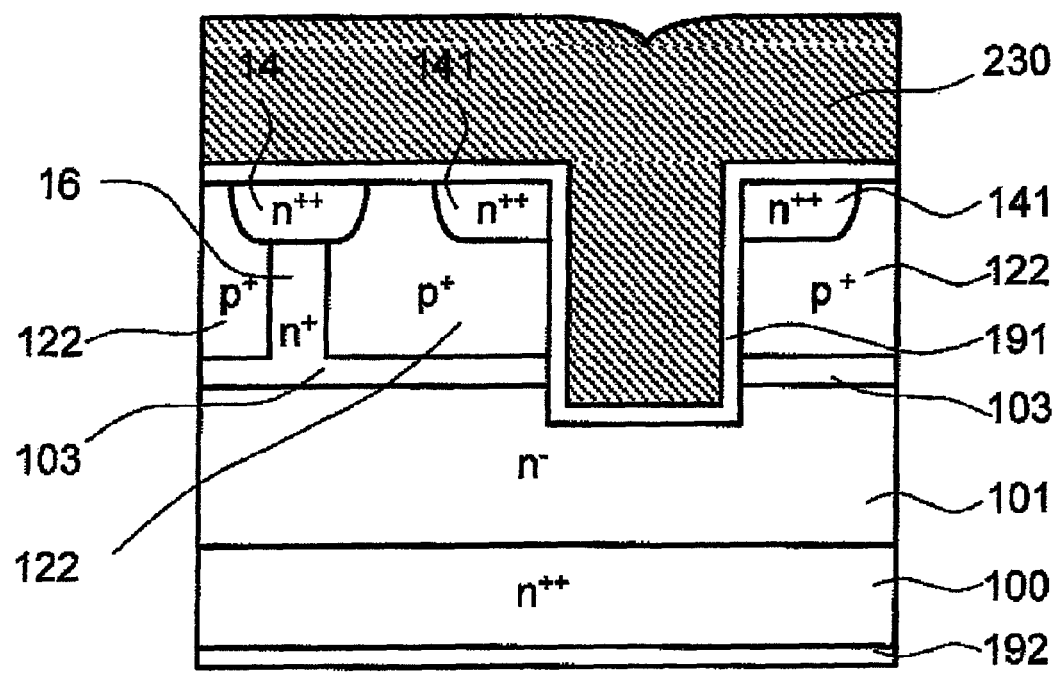
FIG. 13E is an explanatory diagram showing the manufacturing process of the semiconductor device shown in FIG. 12.
Figure 13F:
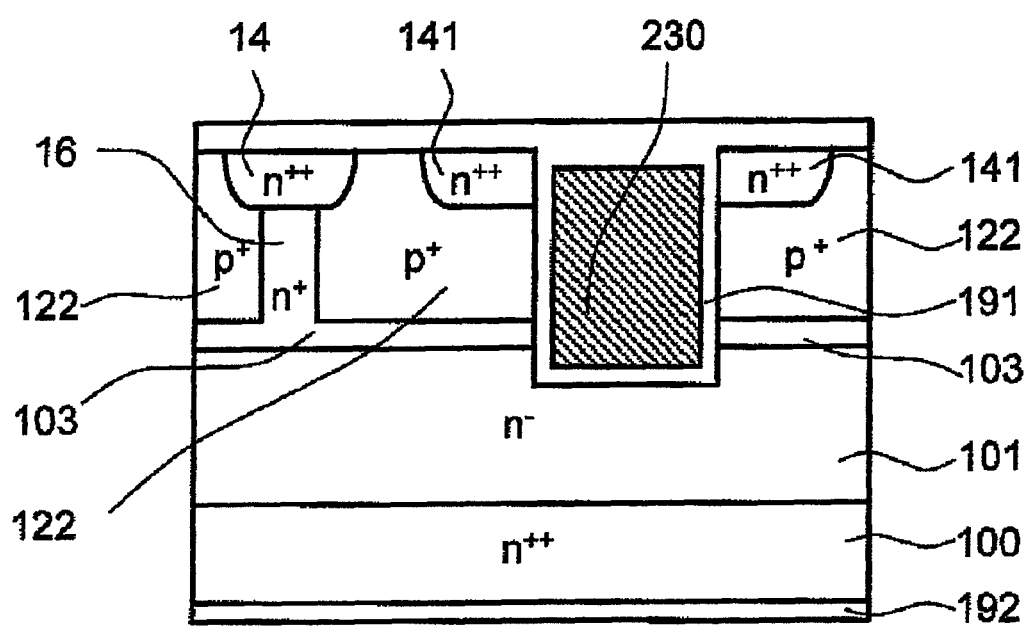
FIG. 13F is an explanatory diagram showing the manufacturing process of the semiconductor device shown in FIG. 12.
Figure 13G:
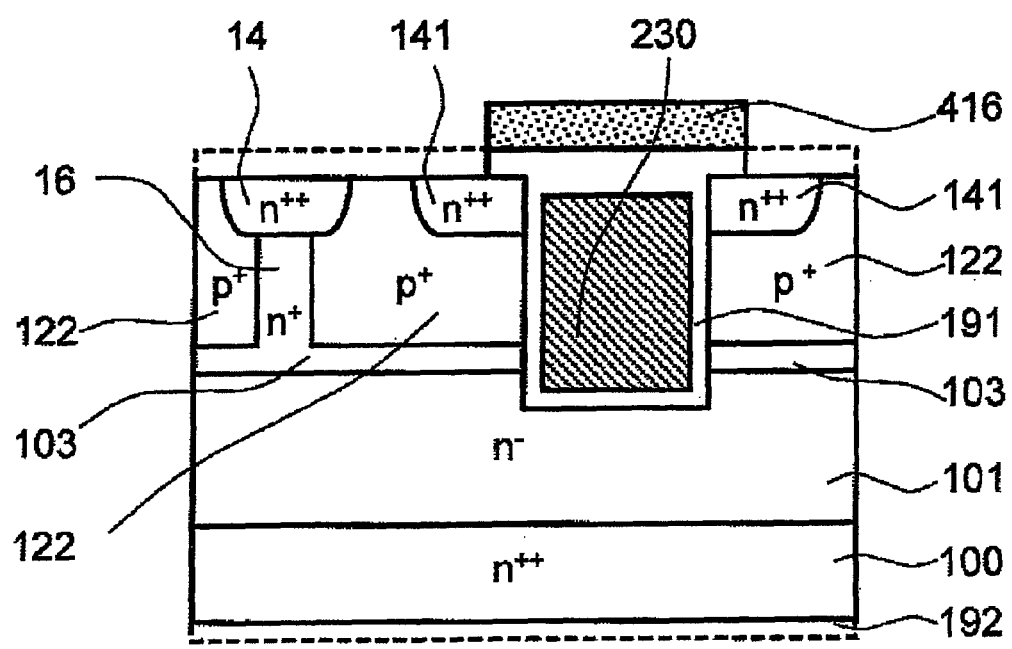
FIG. 13G is an explanatory diagram showing the manufacturing process of the semiconductor device shown in FIG. 12.

The process for manufacturing the structure of FIG. 12 will be schematically described below with reference to FIG. 13A to FIG. 13G. For achieving the breakdown voltage of 600 V or higher, an n− layer 101 with a nitrogen concentration of $1 \times 10^{16}$ cm$^{-3}$ and a thickness of 6.0 μm and an n+ layer 103 with a nitrogen concentration of $1.5 \times 10^{17}$ cm$^{-3}$ and a thickness of 1.5 μm are epitaxially grown on the high-concentration n type 4H-SiC substrate 100 functioning as an n++ cathode layer and an n++ drain layer, and after forming a CVD-SiO$_2$ film 414 on the n+ layer 103, a mask pattern for forming trenches is formed based on the pattern formed by lithography (FIG. 13A). After forming the trenches 300 with a depth of 1.2 μm by dry etching, the mask pattern 411 is removed, and a p+ layer 122 with a concentration of $2 \times 10^{18}$ cm$^{-3}$ is formed by the epitaxial growth using Al as a dopant, thereby filling the trenches (FIG. 13B). Thereafter, the surface of the p+ layer 122 is etched back (the p+ layer 122 is etched back to the dotted line). Also in the present embodiment, the p+ layer 122 is etched back so as not to completely expose the n+ layer 103 and 0.05 μm of the p+ layer 122 is left like in the first embodiment. This is for the purpose of preventing the shortage of the length of the channel formed in the following process due to the overetching, but since the channel length can be adjusted in the next process, the overetching of the n+ layer 103 of about 0.1 μm is permissible. FIG. 13C shows a process of forming the n++ anode region 14 and the n++ source region 141. After the etching back, a CVD-SiO$_2$ film 414 is formed, and then, a mask pattern for ion implantation is formed based on the pattern formed by the lithography and nitrogen ion 426 is implanted. The implantation is carried out by multi-step implantation of 25 to 110 keV so that the interface between the n+ layer 103 and the n++ anode 14 is located at 0.25 μm from the surface. After the implantation, the mask pattern 414 is removed and the thermal activation treatment is carried out at 1700° C. Subsequently, a CVD-SiO$_2$ film 415 is formed, and a pattern for a trench 301 is formed so as to split the n++ source region 141 which is already formed by lithography (FIG. 13D). After forming the trench 301 by the dry etching, the gate insulating film 191 is formed by a method such as the thermal oxidation and polycrystalline silicon 230 is deposited thereon by the CVD to form the gate electrode (FIG. 13E). The polycrystalline silicon 230 is etched back for removing the unnecessary gate wiring to leave the polycrystalline silicon 230 only in the trench. In order to ensure the insulation between the polycrystalline silicon gate electrode 230 and the source electrode functioning also as an anode electrode formed in the latter process, a SiO$_2$ film is formed on the polycrystalline silicon gate electrode 230 by oxidation or CVD (FIG. 13F). Thereafter, a mask pattern 416 for forming a source contact functioning also as an anode contact is formed, and the unnecessary insulating film on the source/anode and the drain/cathode is removed (FIG. 13G).

Thereafter, through the process of forming electrodes though not shown, the device in which the SiC-MOSFET 52 is used as a switching element for current control and the field-effect diode 50 of the present invention is combined therewith as a flywheel diode and fabricated on the same substrate shown in FIG. 12 is completed. Note that Ni is used for the cathode electrode 10 and the anode electrode.

Similarly to the third embodiment, although the structure in which a Schottky diode and a MOSFET are formed on the same substrate has already been known, the low start-up voltage cannot be achieved in that case as described above. Furthermore, in the SiC-MOSFET, for the purpose of the reduction of the interface state and the improvement of the mobility, a process such as nitriding treatment is adopted in addition to the normal thermal oxidation in forming a gate insulating film. Although it is after the nitriding process that the Schottky diode is formed, the interface state between the insulating film and SiC after the oxidation and nitriding treatment is sometimes different from that after the normal oxidation treatment. As a result, the SiC surface state after the contact window for forming the Schottky electrode is formed by etching is also made different from the SiC surface state after the normal oxidation treatment, and the potential barrier φB of the Schottky electrode is also changed. When the potential barrier φB is increased, the start-up voltage of the diode is further increased, and when the potential barrier φB is decreased to the contrary, the start-up voltage is lowered, but it simultaneously causes the problem of the increase of the leakage current in the blocking state. On the other hand, since no Schottky interface is present in the present invention, the problem described above does not occur and both the good MOSFET characteristics and the low start-up voltage of the diode can be achieved at the same time.

Fifth Embodiment

Figure 14:
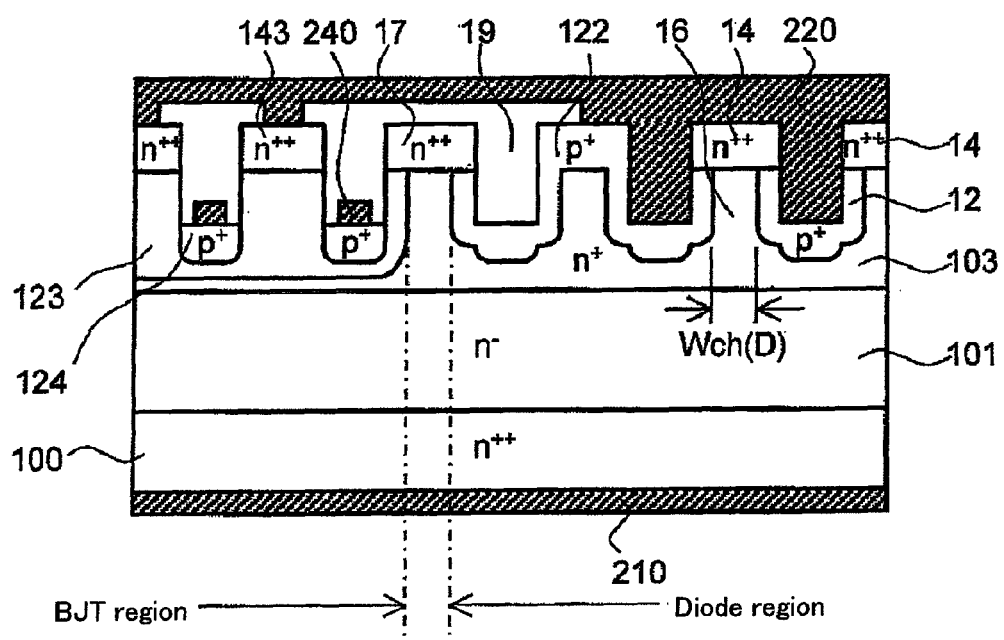
FIG. 14 is a schematic cross-sectional view showing the fifth embodiment of the present invention in which the diode of the present invention and a bipolar transistor are combined and realized on the same substrate.

In the third embodiment and the fourth embodiment, the combination of the field-effect diode of the present invention has been described in combination with a field-effect switching element such as a junction FET and a MOSFET, but a bipolar transistor (BJT) is also used as a switching element to be combined. FIG. 14 is a schematic cross-sectional view showing an example in which this combination is realized on the same substrate. In the case of the BJT, the injection efficiency of the base and the transportation efficiency of the injected minority carriers greatly affect the device characteristics, and it is thus necessary to suppress the surface recombination at the base-emitter interface and around the interface. For the suppression of the surface recombination, the interface charge and the interface state of an oxide film for protecting the surface have to be reduced in addition to forming the device structure in which a high-concentration pn junction is not exposed on the surface. This is the problem similar to that of the MOSFET described in the fourth embodiment, but since there is no limitation to the thermal treatment process for improving the quality of the oxide film like in the case of the MOSFET, both the good BJT characteristics and the low start-up voltage of the diode can be achieved at the same time.

What is claimed is:

1. A semiconductor device using silicon carbide as a substrate, the semiconductor device comprising:
   a cathode electrode;
   a cathode layer of a first conductivity type formed on the cathode electrode of the substrate and having a first impurity concentration;
   a drift layer of the first conductivity type formed on the cathode layer and having a second impurity concentration lower than the first impurity concentration;
   a pair of first semiconductor regions of a second conductivity type opposite to the first conductivity type formed above the drift layer, and having a third impurity concentration;
   a channel region of the first conductivity type formed between the drift layer and the first semiconductor regions and sandwiched between the pair of first semiconductor regions and having a fourth impurity concentration higher than the second impurity concentration;
   an anode region of the first conductivity type formed on the channel region and the pair of first semiconductor regions, and having a fifth impurity concentration higher than the third impurity concentration and the fourth impurity concentration; and
   an anode electrode formed on the pair of first semiconductor regions and the anode region.

2. The semiconductor device according to claim 1, wherein the first conductivity type is an n type and the second conductivity type is a p type.

3. The semiconductor device according to claim 1, wherein the second impurity concentration is $5 \times 10^{15}$ cm$^{-3}$ or higher and $1.8 \times 10^{16}$ cm$^{-3}$ or lower.

4. The semiconductor device according to claim 1, wherein the second impurity concentration is $8 \times 10^{15}$ cm$^{-3}$ or higher and $1.5 \times 10^{16}$ cm$^{-3}$ or lower.

5. The semiconductor device according to claim 1, wherein the fourth impurity concentration is $8 \times 10^{16}$ cm$^{-3}$ or higher and $1.8 \times 10^{17}$ cm$^{-3}$ or lower.

6. The semiconductor device according to claim 3, wherein the fourth impurity concentration is $8 \times 10^{16}$ cm$^{-3}$ or higher and $1.8 \times 10^{17}$ cm$^{-3}$ or lower.

7. The semiconductor device according to claim 6, wherein the fifth impurity concentration is $2 \times 10^{20}$ cm$^{-3}$.

8. The semiconductor device according to claim 1, wherein the anode region is wider than the width of the channel region between the pair of first semiconductor regions.

* * * * *